US012812858B2

(12) United States Patent

Kim et al.

(10) Patent No.: US 12,812,858 B2

(45) Date of Patent: Nov. 24, 2026

(54) SEMICONDUCTOR DEVICE AND MANUFACTURING METHOD THEREOF, AND ELECTRONIC SYSTEM INCLUDING THE SEMICONDUCTOR DEVICE

(71) Applicant: Samsung Electronics Co., Ltd., Suwon-si (KR)

(72) Inventors: Dongyoung Kim, Suwon-si (KR); Daihong Kim, Suwon-si (KR); Iksoo Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 432 days.

(21) Appl. No.: 18/482,963

(22) Filed: Oct. 9, 2023

(65) Prior Publication Data

US 2024/0172445 A1 May 23, 2024

(30) Foreign Application Priority Data

Nov. 18, 2022 (KR) ........................ 10-2022-0155795

(51) Int. Cl.

*H10B 43/27* (2023.01)
*G11C 16/04* (2006.01)

(Continued)

(52) U.S. Cl.

CPC ......... *H10B 43/27* (2023.02); *G11C 16/0483* (2013.01); *H10B 41/10* (2023.02); *H10B 41/27* (2023.02); *H10B 41/35* (2023.02); *H10B 41/40* (2023.02); *H10B 43/10* (2023.02); *H10B 43/35* (2023.02); *H10B 43/40* (2023.02); *H10W 20/42* (2026.01); *H10W 20/435* (2026.01)

(58) Field of Classification Search

CPC ....... H10B 43/27; H10B 41/27; H10W 20/42; H10W 20/435

See application file for complete search history.

(56) References Cited

U.S. PATENT DOCUMENTS 8,765,598 B2 7/2014 Smith et al.
9,997,405 B2 6/2018 Chandrashekar et al.

(Continued)

OTHER PUBLICATIONS

Extended European Search Report dated Apr. 12, 2024 for corresponding European Patent Application No. 23210410.9.

*Primary Examiner* — Douglas M Menz

(74) *Attorney, Agent, or Firm* — Harness, Dickey & Pierce, P.L.C.

(57) ABSTRACT

A semiconductor device may include gate electrodes spaced apart from each other in a first direction on a substrate and including pads in a stepped shape, a channel extending through the gate electrodes, a first through via, first and second separation insulating layers, and an insulating pattern. The gate electrodes may include second gate electrodes below a first gate electrode. The first through via may pass through and electrically connect to a first pad of the first gate electrode, pass through the second gate electrodes, and include a connection portion connected to a conductive pillar. The connection portion may contact the first pad. The first separation insulating layer may be on an upper surface of the connection portion. The second separation insulating layer may be on a bottom surface of the connection portion. The insulating pattern may be between the first through via and sidewalls of the second gate electrodes.

20 Claims, 35 Drawing Sheets

(51) Int. Cl.

| | |
|---|---|
| ***H10B 41/10*** | (2023.01) |
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/35*** | (2023.01) |
| ***H10B 43/40*** | (2023.01) |
| ***H10W 20/41*** | (2026.01) |
| ***H10W 20/42*** | (2026.01) |

(56) References Cited

U.S. PATENT DOCUMENTS

| | | | | |
|---|---|---|---|---|
| 2016/0240476 | A1* | 8/2016 | Takahashi ............. | H10W 20/42 |
| 2021/0098367 | A1 | 4/2021 | Lee | |
| 2021/0134832 | A1* | 5/2021 | Choi ...................... | H10B 43/10 |
| 2021/0193672 | A1 | 6/2021 | Kim et al. | |
| 2022/0013651 | A1 | 1/2022 | Kang et al. | |
| 2022/0139831 | A1 | 5/2022 | Kim et al. | |
| 2022/0157831 | A1 | 5/2022 | Baek et al. | |

* cited by examiner

II-II'

SEMICONDUCTOR DEVICE AND MANUFACTURING METHOD THEREOF, AND ELECTRONIC SYSTEM INCLUDING THE SEMICONDUCTOR DEVICE

CROSS-REFERENCE TO RELATED APPLICATION

This application is based on and claims priority under 35 U.S.C. § 119 to Korean Patent Application No. 10-2022-0155795, filed on Nov. 18, 2022 in the Korean Intellectual Property Office, the disclosure of which is incorporated by reference herein in its entirety.

BACKGROUND

Inventive concepts relate to a semiconductor device, a manufacturing method thereof, and an electronic system including the semiconductor device, and more particularly, to a semiconductor device having a vertical channel, a manufacturing method thereof, and an electronic system including the semiconductor device.

In an electronic system requiring data storage, a semiconductor device capable of storing high-capacity data may be required. Accordingly, a method of increasing the data storage capacity of a semiconductor device is being studied. For example, as one of the methods of increasing the data storage capacity of a semiconductor device, a semiconductor device including memory cells arranged three-dimensionally instead of memory cells arranged two-dimensionally has been proposed.

SUMMARY

Inventive concepts provide a semiconductor device capable of limiting and/or preventing defects in a pad structure forming process and a manufacturing method thereof.

Inventive concepts also provide an electronic system including the semiconductor device.

According to an embodiment of inventive concepts, a semiconductor device may include a substrate; gate electrodes on an upper surface of the substrate, the gate electrodes including pads disposed in a stepped shape, the gate electrodes being spaced apart from each other in a first direction, the first direction perpendicular to the upper surface of the substrate, the gate electrodes including a first gate electrode and second gate electrodes, the second gate electrodes below the first gate electrode; a channel extending in the first direction through the gate electrodes; a first through via passing through and electrically connected to a first pad of the first gate electrode, the first through via passing through the second gate electrodes, the first through via including a conductive pillar extending in the first direction and a connection portion connected to the conductive pillar, the connection portion being in contact with the first pad of the first gate electrode; a first separation insulating layer on an upper surface of the connection portion of the first through via; a second separation insulating layer on a bottom surface of the connection portion of the first through via; and an insulating pattern between the first through via and sidewalls of the second gate electrodes opposing the first through via.

According to an embodiment of inventive concepts, a semiconductor device may include a cell stack on a substrate, the cell stack including gate electrodes and mold insulating layers alternately disposed in a first direction perpendicular to an upper surface of the substrate, the gate electrodes including step-shaped pads, the cell stack further including a cover insulating layer covering the step-shaped pads, the gate electrodes including a first gate electrode and second gate electrodes, the second gate electrodes below the first gate electrode; a channel passing through the cell stack and extending in the first direction; a first through via passing through the cell stack and extending in the first direction, the first through via being connected to a first pad of the first gate electrode and passing though the second gate electrodes, the first through via including a conductive pillar and a connection portion, the connection portion protruding outward laterally from the conductive pillar; an insulating pattern between the first through via and sidewalls of the second gate electrodes opposing the first through via, the insulating pattern electrically insulating the first through via and the second gate electrodes from each other; a sidewall insulating layer surrounding sidewalls of the conductive pillar of the first through via; and a first separation insulating layer on an upper surface of the connection portion of the first through via.

According to an embodiment of inventive concepts, a semiconductor device may include a substrate; a circuit pattern on the substrate; a wiring pattern on the substrate and electrically connected to the circuit pattern; a lower interlayer insulating film on the substrate, the lower interlayer insulating film covering the circuit pattern and the wiring pattern; a common source plate on the lower interlayer insulating film; gate electrodes on the common source plate, the gate electrodes being spaced apart from each other in a first direction perpendicular to an upper surface of the substrate, the gate electrodes including pads disposed in a stepped shape, the gate electrodes including a first gate electrode and second gate electrodes, the second gate electrodes below the first gate electrode; a channel extending in the first direction through the gate electrodes; a first through via passing through and electrically connected to a first pad of the first gate electrode, the first through via passing through the second gate electrodes, the first through via including a conductive pillar extending in the first direction and a connection portion connected to the conductive pillar, the connection portion contacting the first pad of the first gate electrode; a sidewall insulating layer surrounding a sidewall of the conductive pillars of the first through via; a first separation insulating layer on an upper surface of the connection portion of the first through via; a second separation insulating layer on a bottom surface of the connection portion of the first through via; an insulating pattern between the first through via and sidewalls of the second gate electrodes facing the first through via; and a blocking insulating layer on upper surfaces of the gate electrodes and sidewalls of the gate electrodes, the blocking insulating layer including a first portion between the first pad and a sidewall of the first separation insulating layer.

According to an embodiment of inventive concepts, a manufacturing method of a semiconductor device may include alternately forming mold insulating layers and sacrificial layers on a substrate; patterning portions of the mold insulating layers and the sacrificial layers, the patterning portions of the mold insulating layers and the sacrificial layers including forming preliminary pads connected to the sacrificial layers and having a stepped shape; forming a through via hole through a first preliminary pad connected to a first sacrificial layer among the sacrificial layers and through second sacrificial layers below the first preliminary pad; forming a first extended opening by removing a portion of the first preliminary pad exposed on an inner wall of the through via hole; performing a seeding treatment on an inner wall of the first extended opening using a seeding precursor including an aminosilane-based compound; forming a separation insulating layer on an inner wall of the first extended opening, the separation insulating layer including a first portion and a second portion, the first portion on an upper side of the first extended opening and a lower side of the first extended opening, the first portion having a first thickness, the second portion on a sidewall of the first extended opening, the second portion having a second thickness, the second thickness being less than the first thickness; replacing the sacrificial layers with gate electrodes and replacing the preliminary pads with gate pads; removing the second portion of the separation insulating layer; and forming a through via filling the through via hole and the first extended opening.

According to an embodiment of inventive concepts, a manufacturing method of a semiconductor device may include alternately forming mold insulating layers and sacrificial layers on a substrate; patterning portions of the mold insulating layers and the sacrificial layers, the patterning portions of the mold insulating layers and the sacrificial layers forming preliminary pads connected to the sacrificial layers and having a stepped shape; forming a cover insulating layer on the mold insulating layers, the sacrificial layers, and the preliminary pads; forming a through via hole through a first preliminary pad connected to a first sacrificial layer among the sacrificial layers and through second sacrificial layers below the first preliminary pad; forming first extended openings and second extended openings by removing the first preliminary pad and the second sacrificial layers exposed on an inner wall of the through via hole; forming a separation insulating layer on an inner wall of the first extended opening, the separation insulating layer including a first portion and a second portion, the first portion on an upper surface of the mold insulating layer and a bottom surface of the cover insulating layer inside the first extended opening, the first portion having a first thickness in a vertical direction, the second portion being on a sidewall of the first sacrificial layer inside the first extended opening, and the second portion having a second thickness that is less than the first thickness; forming insulating patterns on inner walls of the second extended openings; replacing the sacrificial layers with gate electrodes and replacing the preliminary pads with pads; removing the second portion of the separation insulating layer; and forming a through via filling the through via hole and the first extended opening.

According to an embodiment of inventive concepts, a manufacturing method of a semiconductor device may include alternately forming mold insulating layers and sacrificial layers on a substrate; patterning portions of the mold insulating layers and the sacrificial layers, the patterning portions of the mold insulating layers and the sacrificial layers forming preliminary pads connected to the sacrificial layers and having a stepped shape; forming a cover insulating layer on the mold insulating layers, the sacrificial layers, and the preliminary pads; forming a through via hole through the cover insulating layer and a first preliminary pad connected to a first sacrificial layer among the sacrificial layers and through second sacrificial layers below the first preliminary pad, the first preliminary pad among the preliminary pads; forming first extended openings and second extended openings by removing the first preliminary pad and the second sacrificial layers exposed on an inner wall of the through via hole; performing seeding treatment on inner walls of the first extended opening and the second extended opening using a seeding precursor including an aminosilane-based compound; forming a separation insulating layer on an inner wall of the first extended opening, the separation insulating layer including a first portion and a second portion, the first portion on an upper side of the first extended opening and a lower side of the first extended opening, the first portion having a first thickness, the second portion on a sidewall of the first extended opening, and the second portion having a second thickness that is less than the first thickness; forming insulating patterns on inner walls of the second extended openings and forming a sidewall insulating layer on inner walls of the through via holes; removing the sacrificial layers; replacing the sacrificial layers with gate electrodes and replacing the preliminary pads with pads; removing the second portion of the separation insulating layer and performing a wet etching process on the separation insulating layer, the wet etching process reducing a thickness of the first portion of the separation insulating layer; and forming a through via filling the through via hole and the first extended opening.

BRIEF DESCRIPTION OF THE DRAWINGS

Embodiments of inventive concepts will be more clearly understood from the following detailed description taken in conjunction with the accompanying drawings in which.

DETAILED DESCRIPTION

Hereinafter, embodiments of inventive concepts will be described in detail with reference to the accompanying drawings.

Figure 1:
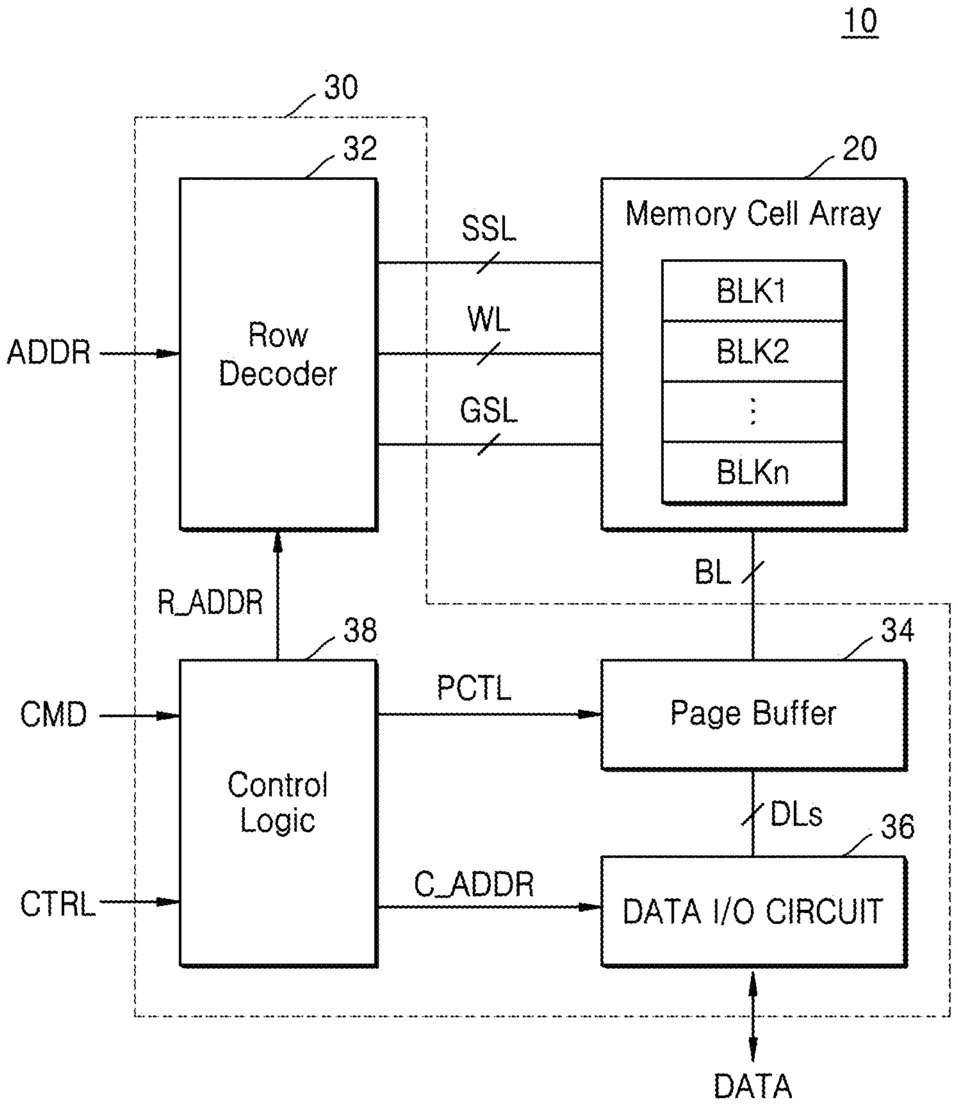
FIG. 1 is a block diagram of a semiconductor device according to example embodiments.

FIG. 1 is a block diagram of a semiconductor device 10 according to example embodiments.

Referring to FIG. 1, the semiconductor device 10 may include a memory cell array 20 and a peripheral circuit 30. The memory cell array 20 includes a plurality of memory cell blocks BLK1, BLK2, . . . , BLKn. Each of the plurality of memory cell blocks BLK1, BLK2, . . . , BLKn may include a plurality of memory cells. The memory cell blocks BLK1, BLK2, . . . , BLKn may be connected to the peripheral circuit 30 through a bit line BL, a word line WL, a string select line SSL, and a ground select line GSL.

The peripheral circuit 30 may include a row decoder 32, a page buffer 34, a data input/output (I/O) circuit 36, and a control logic 38. Although not shown in FIG. 1, the peripheral circuit 30 may further include an I/O interface, column logic, a voltage generator, a pre-decoder, a temperature sensor, a command decoder, an address decoder, an amplifier circuit, and the like.

The memory cell array 20 may be connected to the page buffer 34 through the bit line BL, and may be connected to the row decoder 32 through the word line WL, the string select line SSL, and the ground select line GSL. In the memory cell array 20, each of the plurality of memory cells included in the plurality of memory cell blocks BLK1, BLK2, . . . , BLKn may be a flash memory cell. The memory cell array 20 may include a three-dimensional memory cell array. The three-dimensional memory cell array may include a plurality of NAND strings, and each NAND string may include a plurality of memory cells respectively connected to a plurality of word lines WL stacked vertically on a substrate.

The peripheral circuit 30 may receive an address ADDR, a command CMD, and a control signal CTRL from the outside of the semiconductor device 10, and may transmit/receive data DATA to and from an external device of the semiconductor device 10.

The row decoder 32 may select at least one of the plurality of memory cell blocks BLK1, BLK2, . . . . BLKn in response to an address ADDR from the outside, and may select a word line WL, a string select line SSL, and a ground select line GSL of the selected memory cell block. The row decoder 32 may transmit a voltage for performing a memory operation to the word line WL of the selected memory cell block.

The page buffer 34 may be connected to the memory cell array 20 through the bit line BL. The page buffer 34 may operate as a write driver during a program operation to apply a voltage according to the data DATA to be stored in the memory cell array 20 to the bit line BL, and may operate as a sense amplifier during a read operation to sense data DATA stored in the memory cell array 20. The page buffer 34 may operate according to a control signal PCTL provided from the control logic 38.

The data I/O circuit 36 may be connected to the page buffer 34 through data lines DLs. The data I/O circuit 36 may receive data DATA from a memory controller (not shown) during a program operation, and may provide the program data DATA to the page buffer 34 based on the column address C_ADDR provided from the control logic 38. The data I/O circuit 36 may provide the read data DATA stored in the page buffer 34 to the memory controller based on the column address C_ADDR provided from the control logic 38 during a read operation.

The data I/O circuit 36 may transmit an input address or command to the control logic 38 or the row decoder 32. The peripheral circuit 30 may further include an Electro Static Discharge (ESD) circuit and a pull-up/pull-down driver.

The control logic 38 may receive a command CMD and a control signal CTRL from the memory controller. The control logic 38 may provide the row address R_ADDR to the row decoder 32 and provide the column address C_ADDR to the data I/O circuit 36. The control logic 38 may generate various internal control signals used in the semiconductor device 10 in response to the control signal CTRL. For example, the control logic 38 may adjust the voltage level provided to the word line WL and the bit line BL when a memory operation, such as a program operation or an erase operation, is performed.

Figure 2:
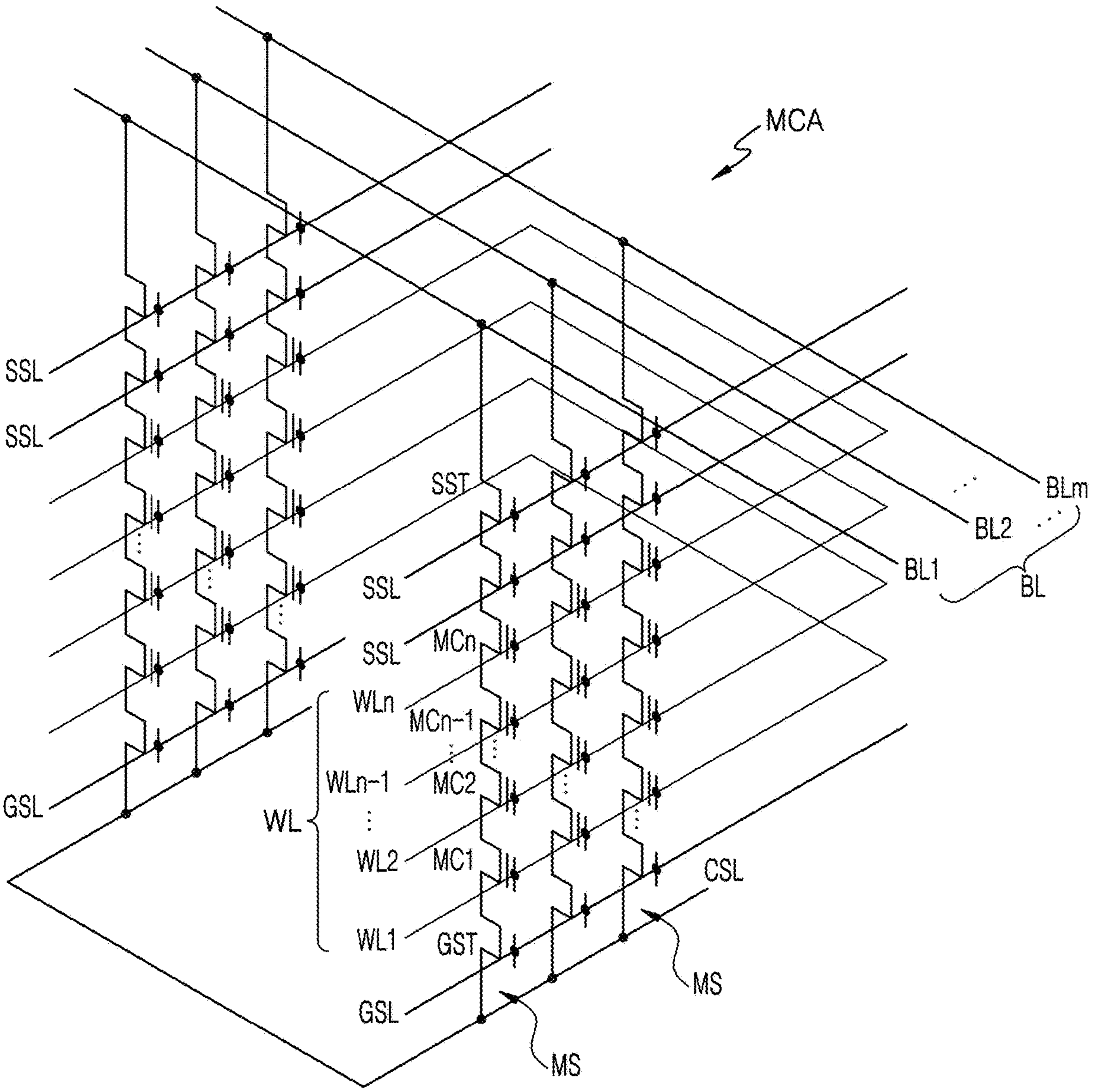
FIG. 2 is an equivalent circuit diagram of a memory cell array of a semiconductor device according to example embodiments.

FIG. 2 is an equivalent circuit diagram of a memory cell array of the semiconductor device 10 according to example embodiments.

Referring to FIG. 2, the memory cell array MCA may include a plurality of memory cell strings MS. The memory cell array MCA includes a plurality of bit lines BL: BL1, BL2, . . . , BLm, a plurality of word lines WL: WL1, WL2, . . . , WLn−1, WLn, at least one string select line SSL, at least one ground select line GSL, and a common source line CSL. A plurality of memory cell strings MS may be formed between the plurality of bit lines BL1, BL2, . . . , BLm and the common source line CSL. FIG. 2 illustrates a case where the plurality of memory cell strings MS each include two string select lines SSL, but inventive concepts are not limited thereto. For example, each of the plurality of memory cell strings MS may include one string select line SSL.

Each of the plurality of memory cell strings MS may include a string select transistor SST, a ground select transistor GST, and a plurality of memory cell transistors MC1, MC2, MCn−1, MCn. A drain region of the string select transistor SST may be connected to bit lines BL1, BL2, . . . , BLm, and a source region of the ground select transistor GST may be connected to a common source line CSL. The common source line CSL may be a region in which the source regions of the plurality of ground selection transistors GST are commonly connected.

The string select transistor SST may be connected to the string select line SSL, and the ground select transistor GST may be connected to the ground select line GSL. The plurality of memory cell transistors MC1, MC2, . . . , MCn−1, and MCn may be respectively connected to a plurality of word lines WL: WL1, WL2, . . . , WLn−1, WLn.

Figure 3:
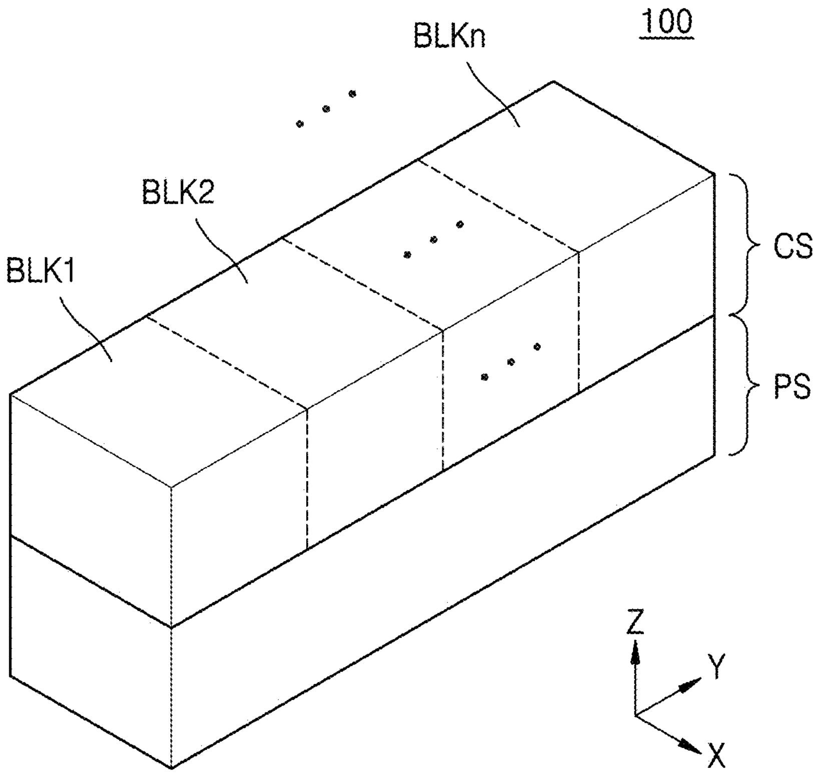
FIG. 3 is a perspective view illustrating a representative configuration of a semiconductor device according to example embodiments.
Figure 4:
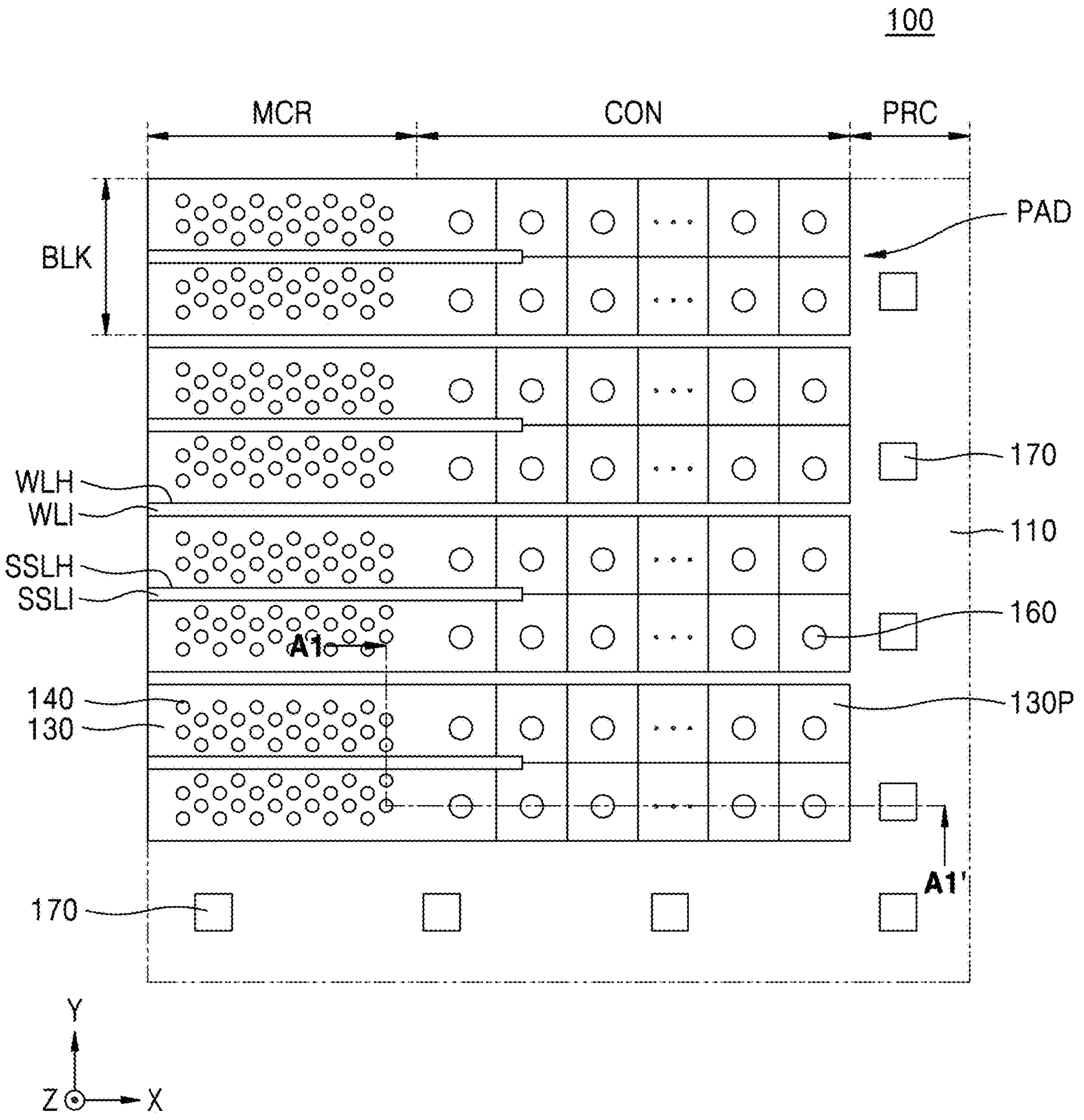
FIG. 4 is a plan view illustrating the semiconductor device of FIG. 3.
Figure 5:
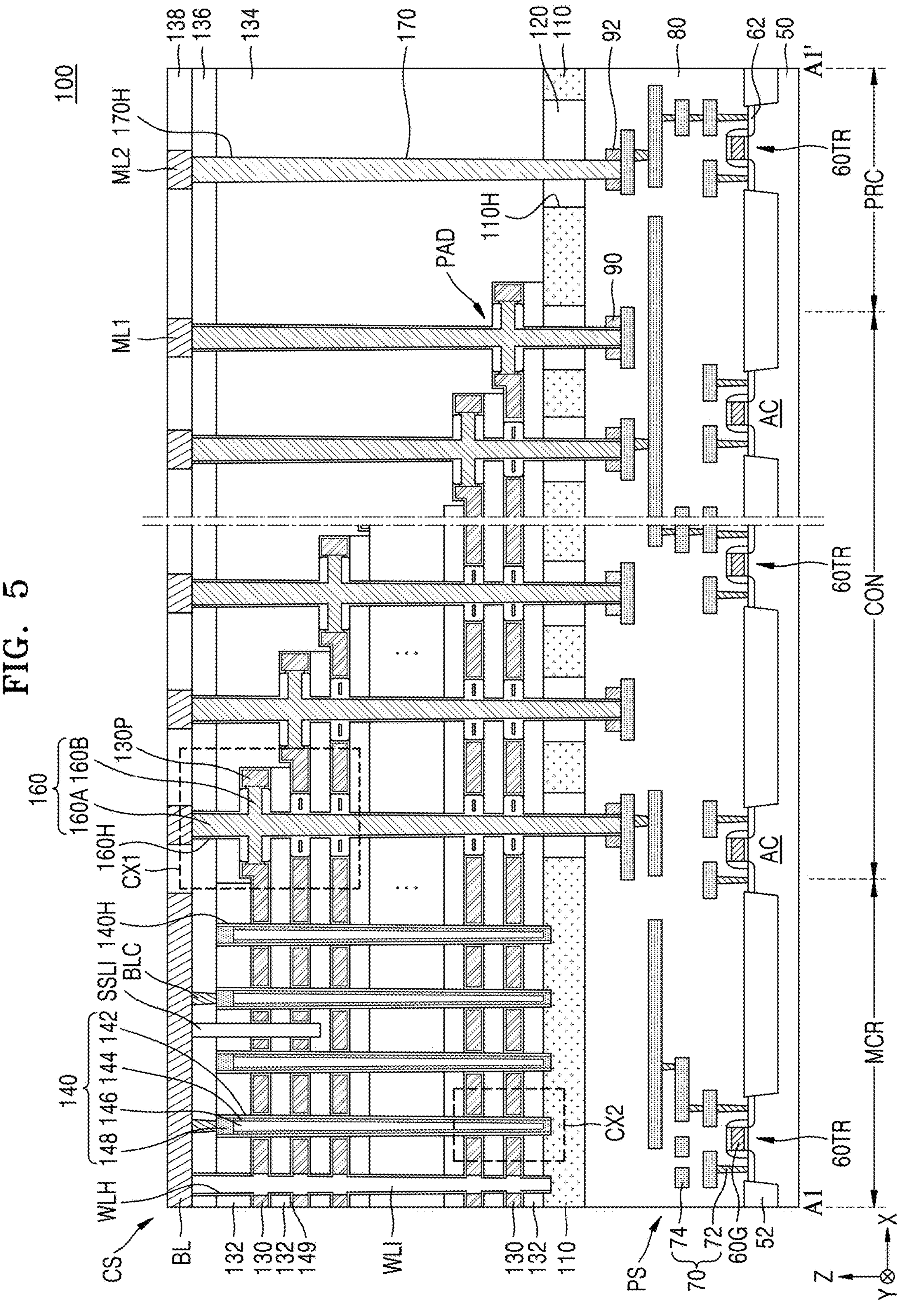
FIG. 5 is a cross-sectional view taken along the line A1-A1' of FIG. 4.
Figure 6:
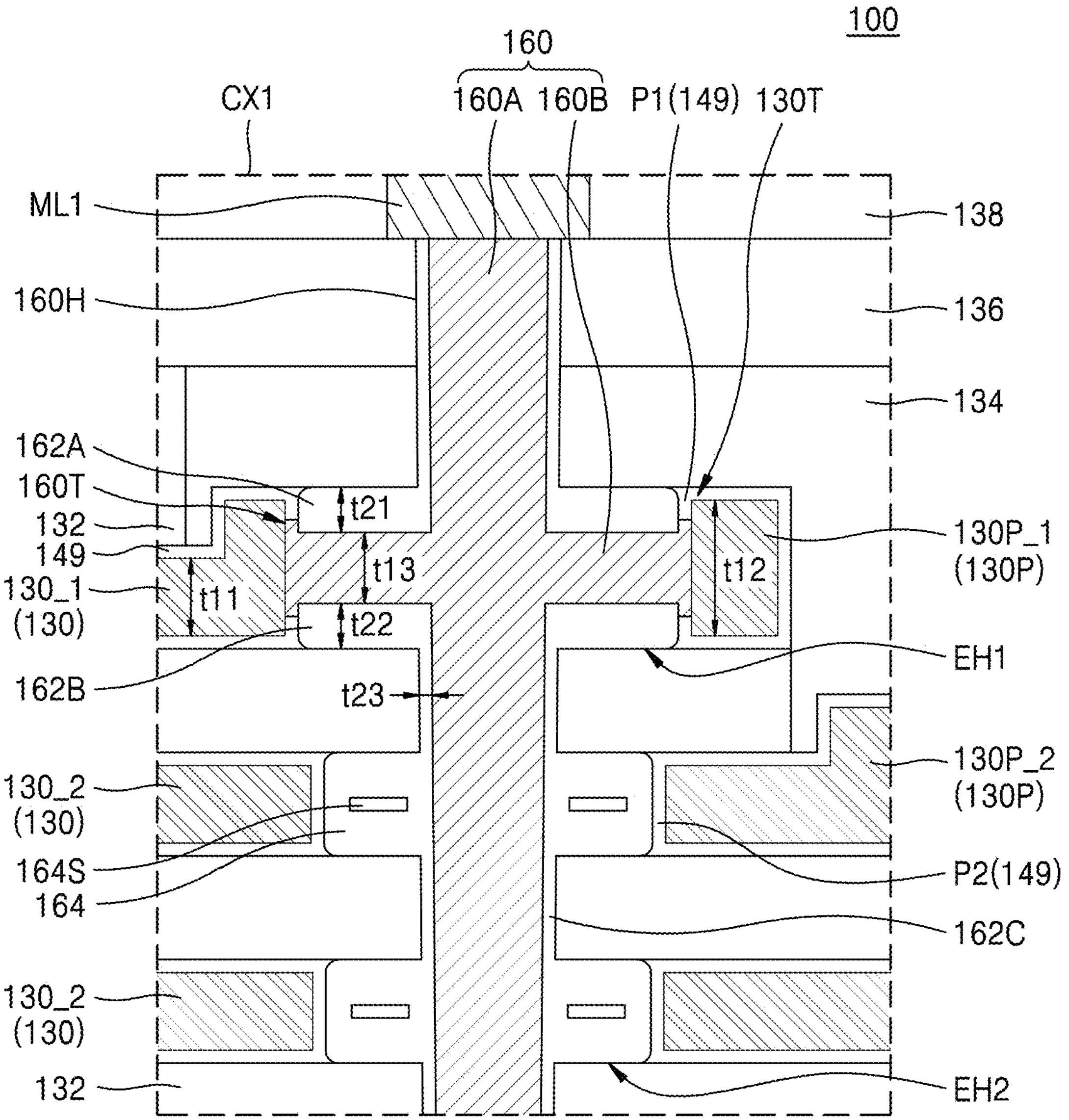
FIG. 6 is an enlarged view of a portion CX1 of FIG. 5.
Figure 7:
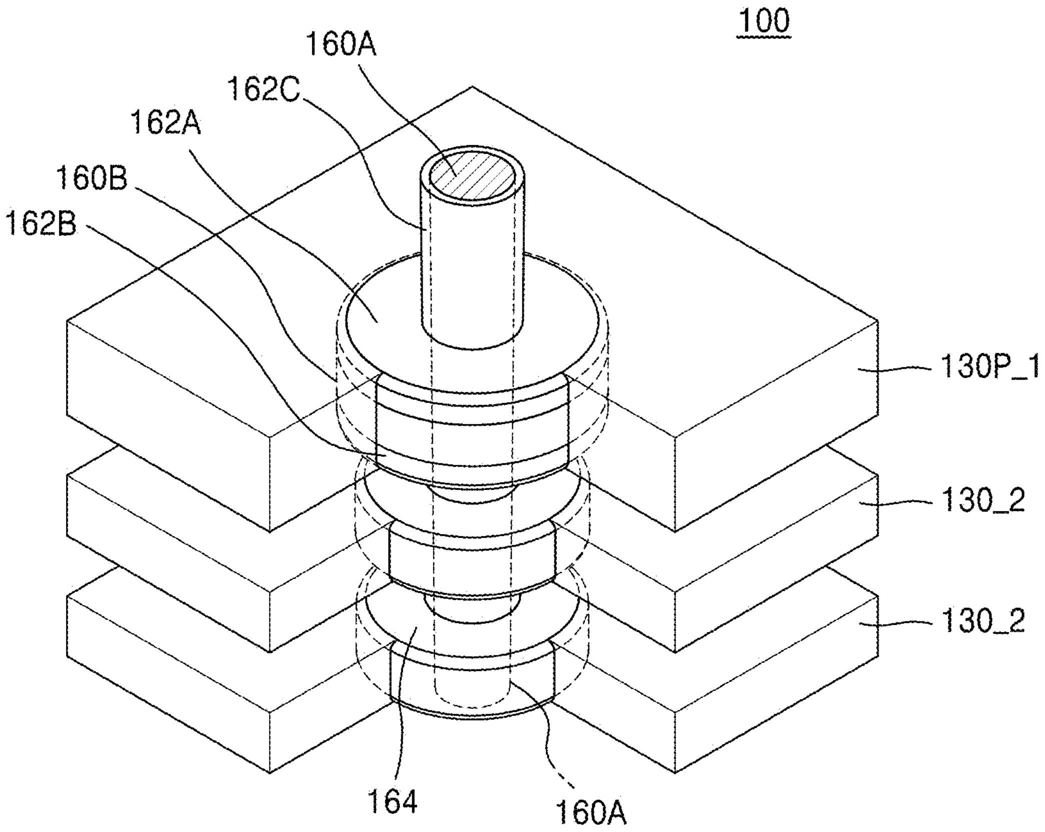
FIG. 7 is a perspective view of a portion CX1 of FIG. 5.
Figure 8:
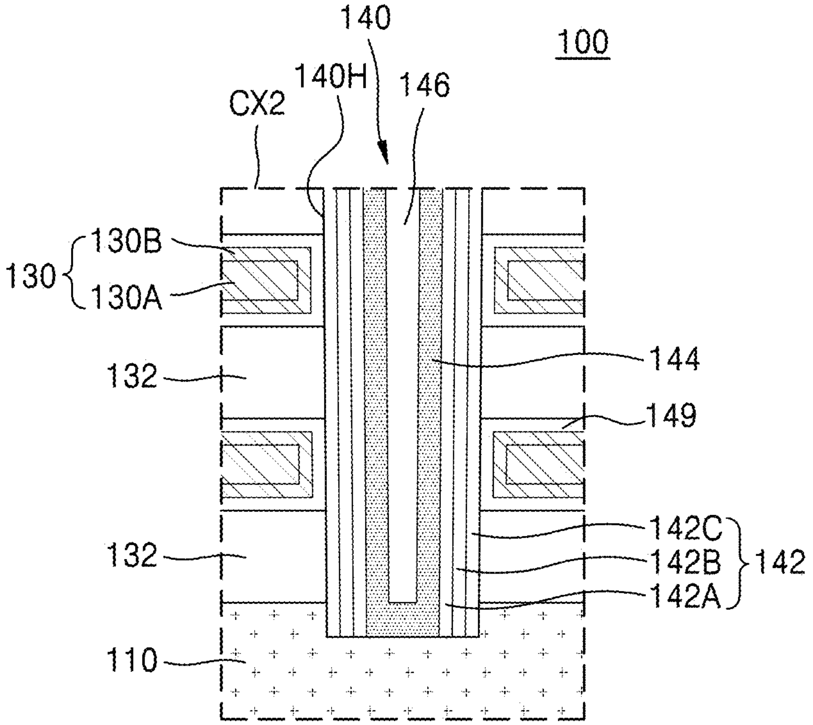
FIG. 8 is an enlarged view of a portion CX2 of FIG. 5.

FIG. 3 is a perspective view illustrating a representative configuration of a semiconductor device 100 according to example embodiments. FIG. 4 is a plan view illustrating the semiconductor device 100 of FIG. 3. FIG. 5 is a cross-sectional view taken along line A1-A1' of FIG. 4. FIG. 6 is an enlarged view of part CX1 of FIG. 5, and FIG. 7 is a perspective view of part CX1 of FIG. 5. FIG. 8 is an enlarged view of part CX2 of FIG. 5.

Referring to FIGS. 3 to 8, the semiconductor device 100 includes a cell array structure CS and a peripheral circuit structure PS overlapping each other in the vertical direction Z. The cell array structure CS may include the memory cell array 20 described with reference to FIG. 1, and the peripheral circuit structure PS may include the peripheral circuit 30 described with reference to FIG. 1.

The memory cell array 20 includes a plurality of memory cell blocks BLK1, BLK2, . . . , BLKn. Each of the plurality of memory cell blocks BLK1, BLK2, . . . , BLKn may include three-dimensionally arranged memory cells.

The peripheral circuit structure PS may include a peripheral circuit transistor 60TR and a peripheral circuit wiring structure 70 disposed on a substrate 50. The substrate 50 may include a horizontally arranged memory cell region MCR, a connection region CON, and a peripheral circuit connection region PRC. In the substrate 50, an active region AC may be defined by a device isolation film 52, and a plurality of peripheral circuit transistors 60TR may be respectively formed on the active regions AC. The plurality of peripheral circuit transistors 60TR may include a peripheral circuit gate 60G and a source/drain region 62 disposed in a portion of the substrate 50 on both sides of the peripheral circuit gate 60G.

The substrate 50 may include a semiconductor material, for example, a Group IV semiconductor, a Group III-V compound semiconductor, or a Group II-VI oxide semiconductor. For example, the Group IV semiconductor may include silicon (Si), germanium (Ge), or silicon-germanium. The substrate 50 may be provided as a bulk wafer or as an epitaxial layer. In another embodiment, the substrate 50 may include a silicon-on-insulator (SOI) substrate or a germanium-on-insulator (GeOI) substrate.

The peripheral circuit wiring structure 70 includes a plurality of peripheral circuit contacts 72 and a plurality of peripheral circuit wiring layers 74. An interlayer insulating film 80 covering the peripheral circuit transistor 60TR and the peripheral circuit wiring structure 70 may be disposed on the substrate 50. The plurality of peripheral circuit wiring layers 74 may have a multilayer structure including a plurality of metal layers disposed at different vertical levels.

A common source plate 110 may be disposed on the interlayer insulating film 80. In example embodiments, the common source plate 110 may function as a source region supplying current to vertical memory cells formed in the cell array structure CS. The common source plate 110 may be disposed on the memory cell region MCR, the connection region CON, and the peripheral circuit connection region PRC of the substrate 50.

In example embodiments, the common source plate 110 may include at least one of silicon (Si), germanium (Ge), silicon germanium (SiGe), gallium arsenide (GaAs), indium gallium arsenide (InGaAs), aluminum gallium arsenide (AlGaAs), and mixtures thereof. Also, the common source plate 110 may include a semiconductor doped with an n-type impurity. Also, the common source plate 110 may have a crystal structure including at least one selected from a group consisting of single crystal, amorphous, and polycrystalline. In some examples, the common source plate 110 may include polysilicon doped with n-type impurities.

The common source plate 110 may include an opening 110H in the connection region CON and the peripheral circuit connection region PRC of the substrate 50, and an insulating plug 120 may be included in the common source plate 110 by filling the inside of the opening 110H. The insulating plug 120 may have an upper surface at the same level as the upper surface of the common source plate 110.

On the memory cell region MCR and the connection region CON, gate electrodes 130 and mold insulating layers 132 may be alternately disposed on the common source plate 110 in the vertical direction Z.

As shown in FIG. 8 as an example, the gate electrodes 130 may include a buried conductive layer 130A and a conductive barrier layer 130B surrounding the upper, bottom, and side surfaces of the buried conductive layer 130A. For example, the buried conductive layer 130A may include a metal, such as tungsten, nickel, cobalt, tantalum, and the like, a metal silicide, such as tungsten silicide, nickel silicide, cobalt silicide, tantalum silicide, and the like, doped polysilicon, or a combination thereof. In some embodiments, the conductive barrier layer 130B may include titanium nitride, tantalum nitride, tungsten nitride, or a combination thereof.

In example embodiments, the gate electrodes 130 may correspond to a ground select line GSL, word lines WL: WL1, WL2, . . . , WLn−1, WLn, and at least one string select line SSL constituting the memory cell string MS (refer to FIG. 2). For example, the lowermost gate electrode 130 may function as a ground select line GSL, the two uppermost gate electrodes 130 may function as string select lines SSL, and the remaining gate electrodes 130 may function as word lines WL. Accordingly, a memory cell string MS in which the ground select transistor GST, the string select transistor SST, and the memory cell transistors MC1, MC2, . . . , MCn−1, MCn therebetween are connected in series may be provided. In some embodiments, at least one of the gate electrodes 130 may function as a dummy word line, but is not limited thereto.

As shown in FIG. 4 as an example, a gate stack separation opening WLH may extend in the first horizontal direction X parallel to the upper surface of the common source plate 110 on the common source plate 110. Gate electrodes 130 disposed between a pair of gate stack separation openings WLH may constitute one block. For example, a first block BLK1 and a second block BLK2 are illustrated as an example in FIG. 3.

A gate stack separation insulating layer WLI filling the inside of the gate stack separation opening WLH may be disposed on the common source plate 110. The gate stack separation insulating layer WLI may include a silicon oxide film, a silicon nitride film, SiON, SiOCN, SiCN, or a combination thereof.

Channels 140 may extend in the vertical direction (Z direction) from the upper surface of the common source plate 110 on the memory cell region MCR through the gate electrodes 130 and the mold insulating layers 132. The channels 140 may be arranged to be spaced apart from each other at preset intervals in the first horizontal direction X, the second horizontal direction Y, and the third horizontal direction (e.g., a diagonal direction). The channels 140 may be arranged in a zigzag shape or a staggered shape.

Each of the channels 140 may be disposed in a channel hole 140H on the memory cell region MCR. Each of the channels 140 may include a gate insulating layer 142, a channel layer 144, a buried insulating layer 146, and a conductive plug 148. The gate insulating layer 142 and the channel layer 144 may be sequentially disposed on a sidewall of the channel hole 140H. For example, the gate insulating layer 142 may be conformally disposed on the sidewall of the channel hole 140H, and the channel layer 144 may be conformally disposed on the sidewall and the bottom of the channel hole 140H. The buried insulating layer 146 filling the remaining space of the channel hole 140H may be disposed on the channel layer 144. The conductive plug 148 may be disposed on the upper side of the channel hole 140H to contact the channel layer 144 and block the entrance of the channel hole 140H. In other embodiments, the buried insulating layer 146 may be omitted, and the channel layer 144 may be formed in a pillar shape that fills the remaining portion of the channel hole 140H.

In example embodiments, the channel layer 144 may be disposed at the bottom of the channel hole 140H to contact the upper surface of the common source plate 110. In some examples, as shown in FIG. 5, the bottom surface of the channel layer 144 may be at a lower vertical level than the upper surface of the common source plate 110, but is not limited thereto.

As shown in FIG. 8 as an example, the gate insulating layer 142 may have a structure including a tunneling dielectric film 142A, a charge storage film 142B, and a blocking dielectric film 142C sequentially on an outer wall of the channel layer 144. The relative thicknesses of the tunneling dielectric film 142A, the charge storage film 142B, and the blocking dielectric film 142C constituting the gate insulating layer 142 are not limited to those illustrated in FIG. 8 and may be variously modified.

The tunneling dielectric film 142A may include silicon oxide, hafnium oxide, aluminum oxide, zirconium oxide, tantalum oxide, or the like. The charge storage film 142B is a region in which electrons passing through the tunneling dielectric film 142A from the channel layer 144 may be stored, and may include silicon nitride, boron nitride, silicon boron nitride, or polysilicon doped with impurities. The blocking dielectric film 142C may be formed of silicon oxide, silicon nitride, or metal oxide having a higher dielectric constant than silicon oxide. The metal oxide may be formed of hafnium oxide, aluminum oxide, zirconium oxide, tantalum oxide, or a combination thereof.

In example embodiments, a blocking insulating layer 149 may be disposed between the channels 140 and the gate electrodes 130. For example, the blocking insulating layer 149 may be disposed between the channels 140 and the gate electrode 130 and on the upper and bottom surfaces of the gate electrode 130. For example, as shown in FIG. 7, the blocking insulating layer 149 may be disposed between the conductive barrier layer 130B and the gate insulating layer 142 and between the conductive barrier layer 130B and the mold insulating layer 132. In example embodiments, the blocking insulating layer 149 may be formed of silicon oxide, silicon nitride, or a metal oxide having a higher permittivity than silicon oxide. The metal oxide may be formed of hafnium oxide, aluminum oxide, zirconium oxide, tantalum oxide, or a combination thereof.

In one block BLK1 or BLK2, the two uppermost gate electrodes 130 may be separated into two parts by a string separation opening SSLH, in a plan view. A string separation insulating layer SSLI is disposed within the string separation opening SSLH, and the two parts may be disposed to be spaced apart from each other in the second horizontal direction Y with a string separation insulating layer SSLI therebetween. The two parts may constitute the string select line SSL described with reference to FIG. 2.

The gate electrodes 130 on the connection region CON may form a pad structure PAD. The lengths of the gate electrodes 130 may decrease in the first horizontal direction X away from the upper surface of the common source plate 110 in the connection region CON. The pad structure PAD may refer to portions of the gate electrode 130 disposed in a step shape. The pad structure PAD may include pads 130P extending from the respective gate electrodes 130. Each of the pads 130P may have a second thickness t12 that is greater than the first thickness t11 of each of the gate electrodes 130.

A cover insulating layer 134 may be disposed on the pad structure PAD, and a first upper insulating layer 136 may be disposed on the uppermost mold insulating layer 132 and the cover insulating layer 134. For example, the blocking insulating layer 149 may extend from the upper surface and bottom surface of the gate electrodes 130 to cover the upper surface and bottom surface of the pad 130P.

On the connection region CON, first through vias 160 penetrating the first upper insulating layer 136, the cover insulating layer 134, the gate electrodes 130, and the mold insulating layers 132 may be disposed. The first through via 160 may be disposed inside a first through via hole 160H penetrating the first upper insulating layer 136, the cover insulating layer 134, the gate electrodes 130, the mold insulating layers 132, and the insulating plug 120.

The first through via 160 may include a buried conductive layer penetrating the gate electrodes 130 and extending in the vertical direction Z, and a conductive barrier layer surrounding side and bottom surfaces of the buried conductive layer. For example, the buried conductive layer may include a metal, such as tungsten, nickel, cobalt, tantalum, and the like, a metal silicide, such as tungsten silicide, nickel silicide, cobalt silicide, tantalum silicide, and the like, doped polysilicon, or a combination thereof. In some embodiments, the conductive barrier layer may include titanium nitride, tantalum nitride, tungsten nitride, or a combination thereof.

The first through via 160 may be electrically connected to a first pad 130P_1 corresponding to (or connected to) the first gate electrode 130_1 among the gate electrodes 130, and may be disposed from the second gate electrodes 130_2 disposed at a vertical level lower than the first pad 130P_1 (or disposed below the first gate electrode 130_1) among the gate electrodes 130.

For example, as shown in FIG. 6, the first through via 160 may include a conductive pillar 160A and a connection portion 160B. For example, the first through via hole 160H may extend in the vertical direction Z through the cover insulating layer 134, the gate electrodes 130, and the mold insulating layers 132, and the conductive pillar 160A may extend in the vertical direction Z inside the first through via hole 160H. The connection portion 160B may extend outwardly (or laterally) with respect to the sidewall of the conductive pillar 160A toward the first gate electrode 130_1. The upper side of the conductive pillar 160A disposed at a vertical level higher than the connection portion 160B extends in the vertical direction Z through the cover insulating layer 134, and the lower side of the conductive pillar 160A disposed at a vertical level lower than the connection portion 160B may extend in the vertical direction Z through the second gate electrodes 130_2 and the mold insulating layers 132.

The connection portion 160B may be surrounded by the first pad 130P_1 and may have an annular shape in a plan view. The connection portion 160B may have a third thickness t13 that is less than the second thickness t12 of the first pad 130P_1. The third thickness t12 may be greater than the first thickness t11.

The first separation insulating layer 162A may be disposed on the upper surface of the connection portion 160B, may have an annular shape in a plan view, and may be surrounded by the first pad 130P_1 of the first gate electrode 130_1. The first separation insulating layer 162A may be disposed between the cover insulating layer 134 and the upper surface of the connection portion 160B.

The second separation insulating layer 162B may be disposed on the bottom surface of the connection portion 160B, may have an annular shape in a plan view, and may be surrounded by the first pad 130P_1 of the first gate electrode 130_1. The second separation insulating layer 162B may be disposed between the bottom surface of the connection portion 160B and the upper surface of the mold insulation layer 132 disposed under the connection portion 160B.

The sidewall insulating layer 162C may be disposed on the sidewall of the conductive pillar 160A. The sidewall insulating layer 162C may be disposed on the inner wall of the first through via hole 160H to surround the sidewall of the conductive pillar 160A, and may be connected to the first separation insulating layer 162A and the second separation insulating layer 162B. For example, the sidewall insulating layer 162C may be integrally formed with the first separation insulating layer 162A and the second separation insulating layer 162B.

In example embodiments, the first separation insulating layer 162A may have a first thickness t21 in the vertical direction Z, and the second separation insulating layer 162B may have a second thickness t22 in the vertical direction Z, and the sidewall insulating layer 162C may have a third thickness t23 in the horizontal direction. In example embodiments, the first thickness t21 and the second thickness t22 may range from about 50 angstroms to about 100 angstroms, and the third thickness t23 may range from about 20 angstroms to about 80 angstroms. For example, the third thickness t23 may be less than the first thickness t21 or the second thickness t22.

The lower side of the conductive pillar 160A of the first through via 160 may be surrounded by the mold insulating layers 132 and the insulating patterns 164. For example, the insulating patterns 164 may be disposed between the second gate electrodes 130_2 and the conductive pillar 160A, and may electrically insulate the second gate electrodes 130_2 from the conductive pillar 160A. In example embodiments, in a plan view, the insulating patterns 164 may have an annular shape. In example embodiments, the insulating patterns 164 may be connected to the sidewall insulating layer 162C, and may be integrally formed with the sidewall insulating layer 162C, for example.

In example embodiments, as shown in FIG. 6, a seam 164S may be formed inside each of the insulating patterns 164. The seam 164S may refer to a space remaining inside the insulating patterns 164 without being filled with an insulating material in the process of forming the insulating patterns 164. In some embodiments, air or gas may be disposed inside the seam 164S. However, in other embodiments, seams may not be formed inside the insulating patterns 164.

As shown in FIG. 6, the blocking insulating layer 149 may extend to the connection portion 160B of the first through via 160 while surrounding the upper and bottom surfaces of the pads 130P. The blocking insulating layer 149 may extend between the pad 130P and the sidewall of the first separation insulating layer 162A and between the pad 130P and the sidewall of the second separation insulating layer 162B. For example, as the first and second separation insulating layers 162A and 162B have rounded sidewalls protruding outward, the first portion P1 of the blocking insulating layer 149 in contact with the sidewalls of the first and second separation insulating layers 162A and 162B may have a shape conforming to the shape of the sidewall of the first and second separation insulating layers 162A and 162B and protruding outward. In addition, the first pad 130P_1 covered by the first portion P1 of the blocking insulating layer 149 may include a protruding portion 130T protruding outwardly conforming to the shape of the first portion P1 of the blocking insulating layer 149.

In example embodiments, the first portion P1 of the blocking insulating layer 149 may have a bottom surface disposed at a higher level than the bottom surface of the first separation insulating layer 162A. The first portion P1 of the blocking insulating layer 149 may include an undercut region defined between the pad 130P and the sidewall of the first separation insulating layer 162A and between the pad 130P and the sidewall of the second separation insulating layer 162B, and a portion of the connection portion 160B contacting the undercut region may be referred to as a tuck portion 160T. The tuck portion 160T may include a portion of the connection portion 160B extending upward between the pad 130P and the first separation insulating layer 162A and a portion of the connection portion 160B extending downward between the pad 130P and the second separation insulating layer 162B.

The first portion P1 of the blocking insulating layer 149 may not be disposed on at least a portion of the sidewall of the first pad 130P_1 facing the first through via 160. The second portion P2 of the blocking insulating layer 149 may be disposed on the sidewall of the second gate electrodes 130_2 facing the first through via 160 and may contact each of the insulating patterns 164.

In example embodiments, a separation insulating layer 162L may be formed inside the first through via hole 160H, the first extended opening EH1, and the second extended opening EH2 using a selective deposition process, and then, the first and second separation insulating layers 162B, the sidewall insulating layer 162C, and the insulating patterns 164 may be formed by performing a wet etching process onto the separation insulating layer 162L. For example, in the selective deposition process, the thickness of the second portion of the separation insulating layer 162L formed on the sidewall of the first extended opening EH1 (for example, on the surface of the sacrificial layer 134) may be formed to be less than that of the first portion formed on the upper and bottom portions of the first extended opening EH1 (e.g., on the surface of the mold insulating layer 132).

Accordingly, for electrical connection between the connection portion 160B of the first through via 160 and the pad 130P, a process of removing the second portion of the separation insulating layer 162L from the sidewall portion of the first extended opening EH1 may be performed for a relatively short time (to obtain a relatively small etching amount), and, reliability deterioration issues related to breakdown, which may occur due to over-etching the insulating pattern 164 or the sidewall insulating layer 162C, may be limited and/or prevented.

A bottom portion of the first through via 160 may be surrounded by a first conductive landing via 90, and the first conductive landing via 90 may be covered by an interlayer insulating film 80. A bottom surface of the first conductive landing via 90 may contact an upper surface of the peripheral circuit wiring layer 74. The first conductive landing via 90 may include polysilicon doped with n-type impurities.

Although not shown, through the gate electrodes 130 and the mold insulating layers 132 from the upper surface of the common source plate 110 in the connection region CON, dummy channels (not shown) extending in the vertical direction Z may be further formed. The dummy channels may be formed to limit and/or prevent leaning or bending of the gate electrode 130 and to secure structural stability during the manufacturing process of the vertical semiconductor device, that is, the semiconductor device 100. The dummy channels may have a structure and shape that are similar to those of the plurality of channels 140.

A second through via hole 170H passing through the insulating plug 120, the cover insulating layer 134, and the first upper insulating layer 136 may be disposed in the peripheral circuit connection region PRC, and a second through via 170 may be disposed in the second through via hole 170H. For example, the second through via 170 may be made of tungsten, titanium, tantalum, copper, aluminum, titanium nitride, tantalum nitride, tungsten nitride, or a combination thereof.

The second conductive landing via 92 may surround the bottom sidewall of the second through via 170 and may be covered by an interlayer insulating film 80. A bottom surface of a second conductive landing via 92 may contact an upper surface of the peripheral circuit wiring layer 74. The second conductive landing via 92 may include polysilicon doped with n-type impurities.

The first through via 160 may be configured to be connected to the peripheral circuit transistor 60TR through the first conductive landing via 90 and the peripheral circuit wiring layer 74, and the second through via 170 may be configured to be connected to the peripheral circuit transistor 60TR through the second conductive landing via 92 and the peripheral circuit wiring layer 74.

On the memory cell region MCR, the bit line contact BLC may pass through the first upper insulating layer 136 and contact the conductive plug 148 of the channels 140, and the bit line BL may be disposed on the bit line contact BLC. A second upper insulating layer 138 covering a sidewall of the bit line BL may be disposed on the first upper insulating layer 136. A wiring line ML1 may be disposed on the second through via 170 on the peripheral circuit connection region PRC.

In general, in a structure including cell contact plugs landed on the upper surface of the pad 130P, as the number of stacked gate electrodes 130 increases, the pad 130P is over-etched in the process of forming the cell contact hole, so that a punch-through defect in which the pad 130P is connected to the gate electrode 130 under the pad 130P may occur. To solve this problem, a structure including a first through via 160 penetrating the gate electrode 130 has been proposed. However, while the connection portion 160B of the first through via 160 and the first pad 130P_1 are electrically connected, it is difficult to secure electrical insulation between the first through via 160 and the second gate electrodes 130_2.

According to the foregoing example embodiments, a separation insulating layer 162L may be formed inside the first through via hole 160H, the first extended opening EH1, and the second extended opening EH2 using a selective deposition process, and then, the first and second separation insulating layers 162A and 162B, the sidewall insulating layer 162C, and the insulating patterns 164 may be formed by performing a wet etching process on the separation insulating layer 162L. Accordingly, for electrical connection between the connection portion 160B of the first through via 160 and the pad 130P, a process of removing the second portion of the separation insulating layer 162L from the sidewall portion of the first extended opening EH1 may be performed for a relatively short time (to obtain a relatively small etching amount), and thus, reliability deterioration issues related to breakdown, which may occur due to over-etching the insulating pattern 164 or the sidewall insulating layer 162C, may be limited and/or prevented.

Figure 9:
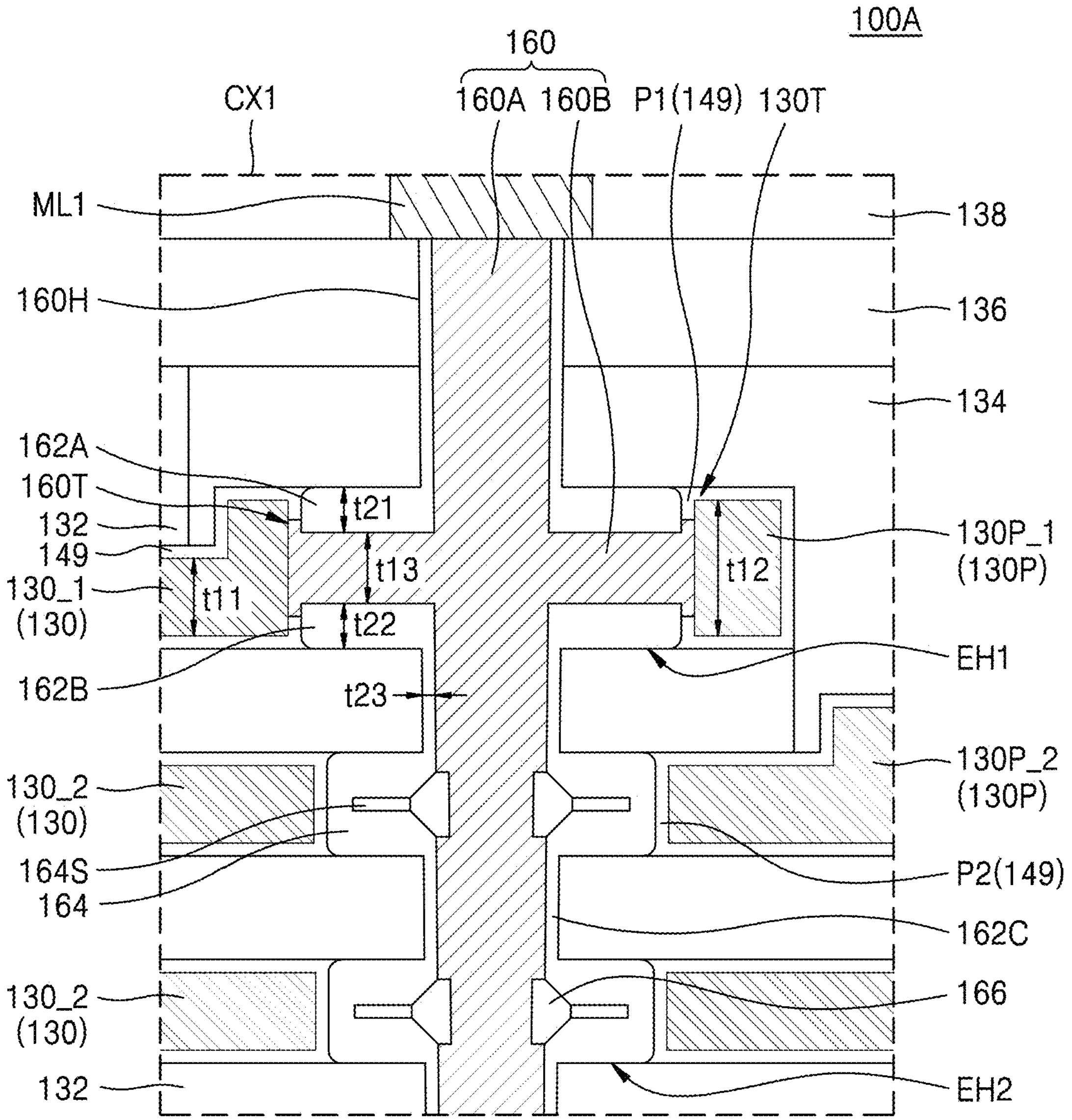
FIG. 9 is a cross-sectional view illustrating a semiconductor device according to example embodiments.

FIG. 9 is a cross-sectional view illustrating a semiconductor device 100A according to example embodiments. In FIG. 9, the same reference numerals as in FIGS. 1 to 8 denote the same components.

Referring to FIG. 9, a wedge pattern 166 may be disposed between the insulating patterns 164 corresponding to the second gate electrodes 130_2 and the first through via 160 (e.g., between the insulating patterns 164 and the sidewall of the conductive pillar 160A). At least a portion of the wedge pattern 166 may contact the seam 164S, and may cover, for example, an inlet of the seam 164S. For example, as the wedge pattern 166 is disposed between the seam 164S and the conductive pillar 160A, in the process of forming the first through via 160, unwanted inflow of a metal material into the seam 164S may be limited and/or prevented. Accordingly, sufficient electrical insulation between the second gate electrodes 130_2 and the first through via 160 may be secured.

Figure 10:
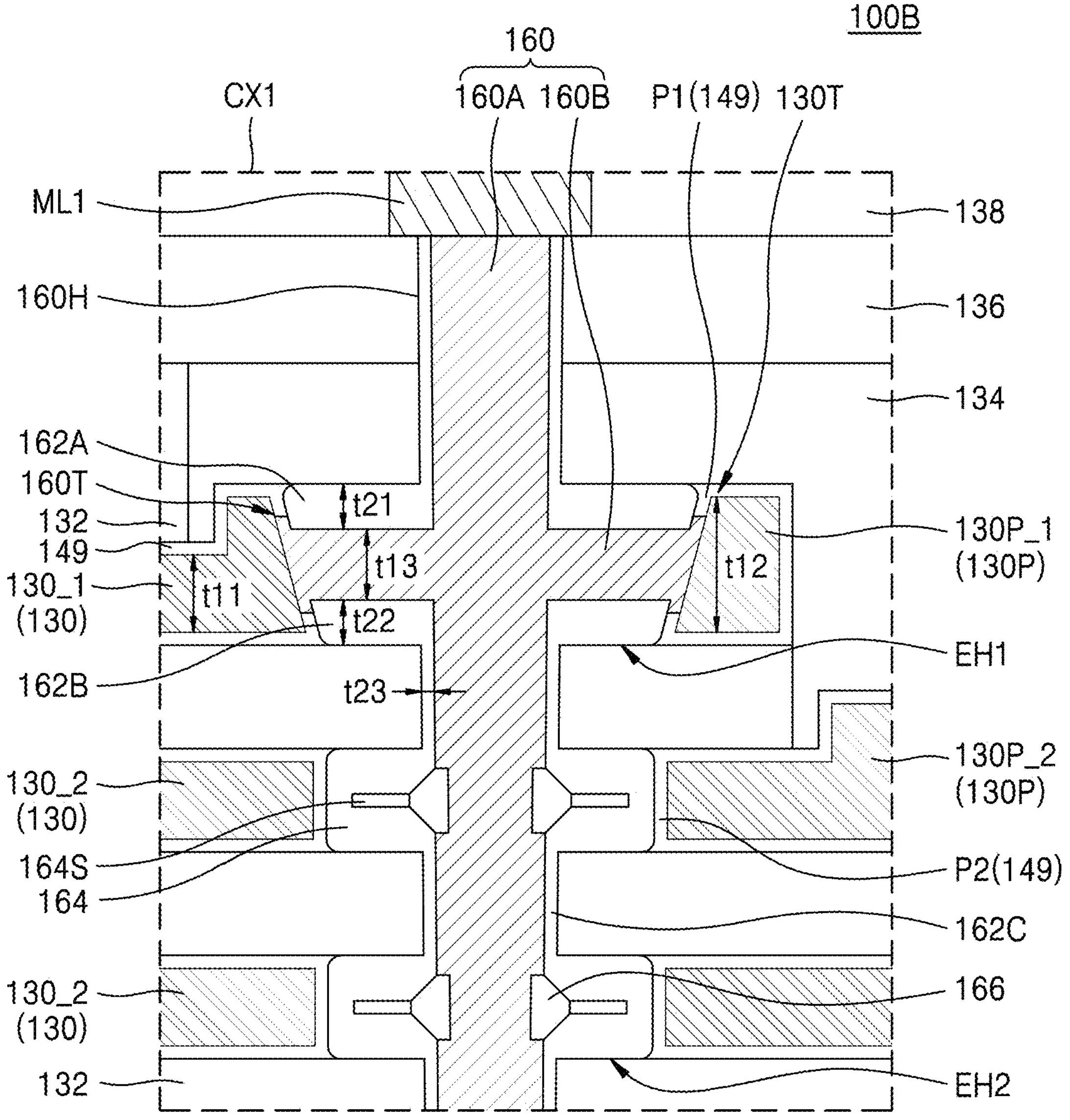
FIG. 10 is a cross-sectional view illustrating a semiconductor device according to example embodiments.

FIG. 10 is a cross-sectional view illustrating a semiconductor device 100B according to example embodiments. Referring to FIG. 10, the connection portion 160B of the first through via 160 may have an inclined sidewall so that the width of the upper side of the connection portion 160B is greater than the width of the lower side of the connection portion 160B. The first separation insulating layer 162A disposed on the upper surface of the connection portion 160B may have a greater width than the second separation insulating layer 162B disposed on the bottom surface of the connection portion 160B.

In example embodiments, in the process of forming the first extended opening EH1 (see FIG. 19) for forming the connection portion 160B, a first preliminary pad layer S130P1 (see FIG. 19) and a second preliminary pad layer S130P2 (see FIG. 19) may have different etching rates, and accordingly, the first extended opening EH1 may be formed to have an inclined sidewall. For example, in the etching process, the second preliminary pad layer S130P2 may be removed at a higher etching rate than the first preliminary pad layer S130P1, and in this case, the first extended opening EH1 may have a shape having sidewalls inclined at an inclination angle so that the width of the upper part of the first extended opening EH1 is greater than the width of the lower part of the first extended opening EH1. In the first extended opening EH1 with an inclined sidewall, the first separation insulating layer 162A disposed above the first extended opening EH1 may be formed to have a larger width than the second separation insulating layer 162B disposed below the first extended opening EH1.

Figure 11:
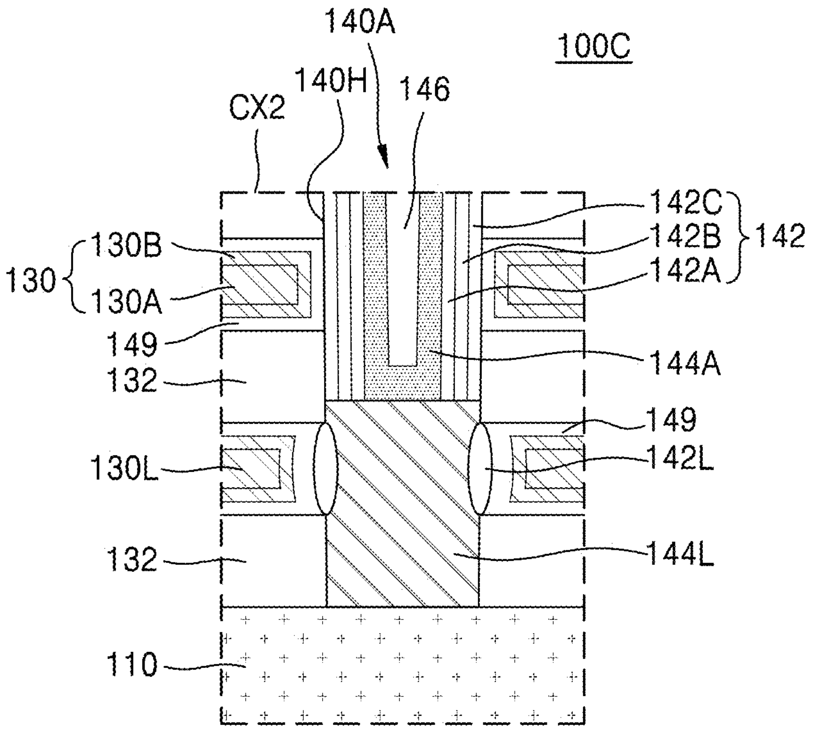
FIG. 11 is a cross-sectional view illustrating a semiconductor device according to example embodiments.

FIG. 11 is a cross-sectional view illustrating a semiconductor device 100C according to example embodiments.

Referring to FIG. 11, a channel 140A may include a gate insulating layer 142, a channel layer 144A, a buried insulating layer 146, and a conductive plug 148, and may further include a contact semiconductor layer 144L and a bottom insulating layer 142L disposed on the bottom of the channel hole 140H. The channel layer 144A does not directly contact the common source plate 110, and the channel layer 144A may be electrically connected to the common source plate 110 through the contact semiconductor layer 144L. In example embodiments, the contact semiconductor layer 144L may include a silicon layer formed by a selective epitaxy growth (SEG) process using the common source plate 110 disposed at the bottom of the channel hole 140H as a seed layer.

The bottom insulating layer 142L may be disposed between the lowermost gate electrode 130L and the contact semiconductor layer 144L. In example embodiments, the bottom insulating layer 142L may include silicon oxide and, for example, may be formed by performing an oxidation process on a portion of a sidewall of the contact semiconductor layer 144L.

Figure 12:
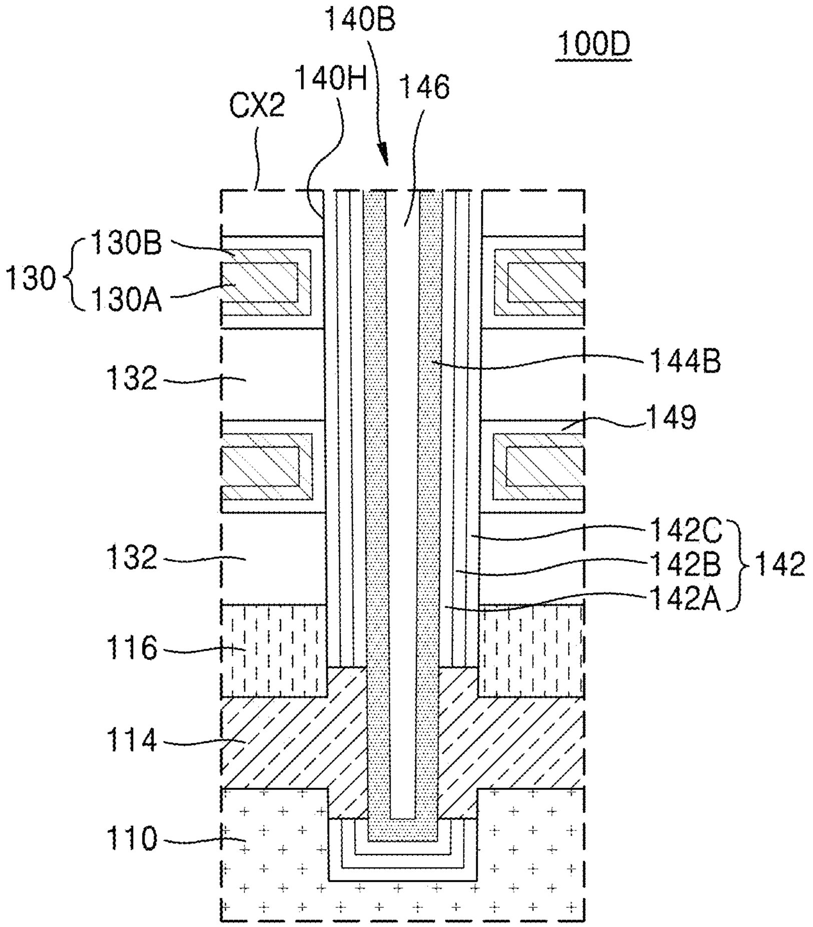
FIG. 12 is a cross-sectional view illustrating a semiconductor device according to example embodiments.

FIG. 12 is a cross-sectional view illustrating a semiconductor device 100D according to example embodiments.

Referring to FIG. 12, a horizontal semiconductor layer 114 and a support layer 116 may be sequentially stacked on the common source plate 110.

In example embodiments, the horizontal semiconductor layer 114 may include doped polysilicon or undoped polysilicon. The horizontal semiconductor layer 114 may function as a part of a common source region connecting the common source plate 110 and the channel layer 144B to each other. For example, the support layer 116 may include doped or undoped polysilicon. The support layer 116 may serve as a support layer for limiting and/or preventing the mold stack from collapsing or collapsing in a process of removing the sacrificial material layer (not shown) for forming the horizontal semiconductor layer 114.

The channel 140B may include a gate insulating layer 142, a channel layer 144B, a buried insulating layer 146, and a conductive plug 148. As shown in FIG. 12 as an example, a gate insulating layer 142 may be disposed on an inner wall and a bottom of the channel hole 140H. The bottom surface of the channel layer 144B is disposed on the gate insulating layer 142 and does not directly contact the common source plate 110, and a bottom sidewall of the channel layer 144B may be surrounded by the horizontal semiconductor layer 114.

Figure 13:
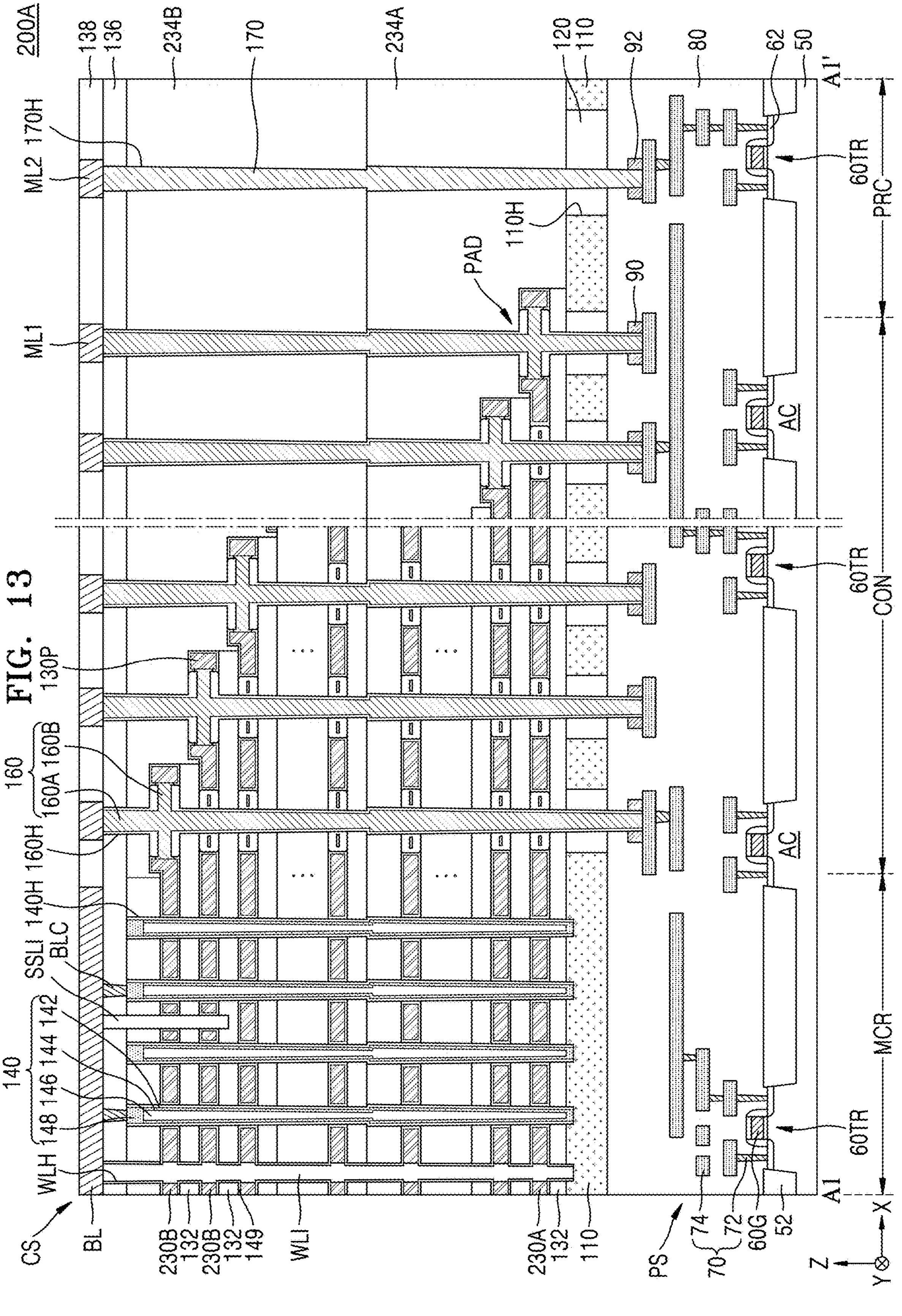
FIG. 13 is a cross-sectional view illustrating a semiconductor device according to example embodiments.

FIG. 13 is a cross-sectional view illustrating a semiconductor device 200 according to example embodiments.

Referring to FIG. 13, a first cover insulating layer 234A may be disposed to cover the lower gate electrodes 230A and the pad structure PAD connected to the lower gate electrodes 230A, and a second cover insulating layer 234B may be disposed to cover the upper gate electrodes 230B and the pad structure PAD connected to the upper gate electrodes 230B on the lower gate electrodes 230A and the first cover insulating layer 234A.

The channels 140 may extend in the vertical direction Z through the lower gate electrodes 230A and the upper gate electrodes 230B. The first through via 160 may extend in the vertical direction Z through the first cover insulating layer 234A and/or the second cover insulating layer 234B and the pad structure PAD, and the second through via 170 may extend in the vertical direction Z through the first cover insulating layer 234A and the second cover insulating layer 234B. A protruding portion protruding outward may be formed on the sidewall of the first through via 160 near the boundary between the first cover insulating layer 234A and the second cover insulating layer 234B, however inventive concepts are not limited thereto.

In FIG. 13, a structure in which the cell array structure CS is disposed on the peripheral circuit structure PS is illustrated as an example, but inventive concepts are not limited thereto. In some embodiments, unlike that illustrated in FIG. 13, the semiconductor device 200A may have a chip to chip (C2C) structure. The C2C structure may refer to that an upper chip including the cell array structure CSA is manufactured on a first wafer, and a lower chip including the peripheral circuit structure PS is manufactured on a second wafer different from the first wafer, and then, the upper chip and the lower chip are connected to each other by a bonding method. For example, the bonding method may refer to a method of electrically connecting the bonding metal formed in the uppermost metal layer of the upper chip and the bonding metal formed in the uppermost metal layer of the lower chip to each other. For example, when the bonding metal is formed of copper (Cu), the bonding method may be a Cu-to-Cu bonding method, and the bonding metal may be formed of aluminum (Al) or tungsten (W). For example, a peripheral circuit structure PS is disposed on the cell array structure CS, and the widths of the lower and upper gate electrodes 230A and 230B in a horizontal direction may increase as the distance from the peripheral circuit structure PS increases.

FIGS. 14 to 28 are cross-sectional views illustrating a method of manufacturing the semiconductor device 100 according to example embodiments. Specifically, FIGS. 14 to 17, 18A, 22A, 23A, and 25A are cross-sectional views corresponding to the cross-section along the line A1-A1' of FIG. 4, and FIGS. 18B, 19 to 21, 22B, 23B, 24, 25B, and 26 to 28 are cross-sectional views corresponding to the cross-section of the portion CX1 of FIG. 5.

Figure 14:
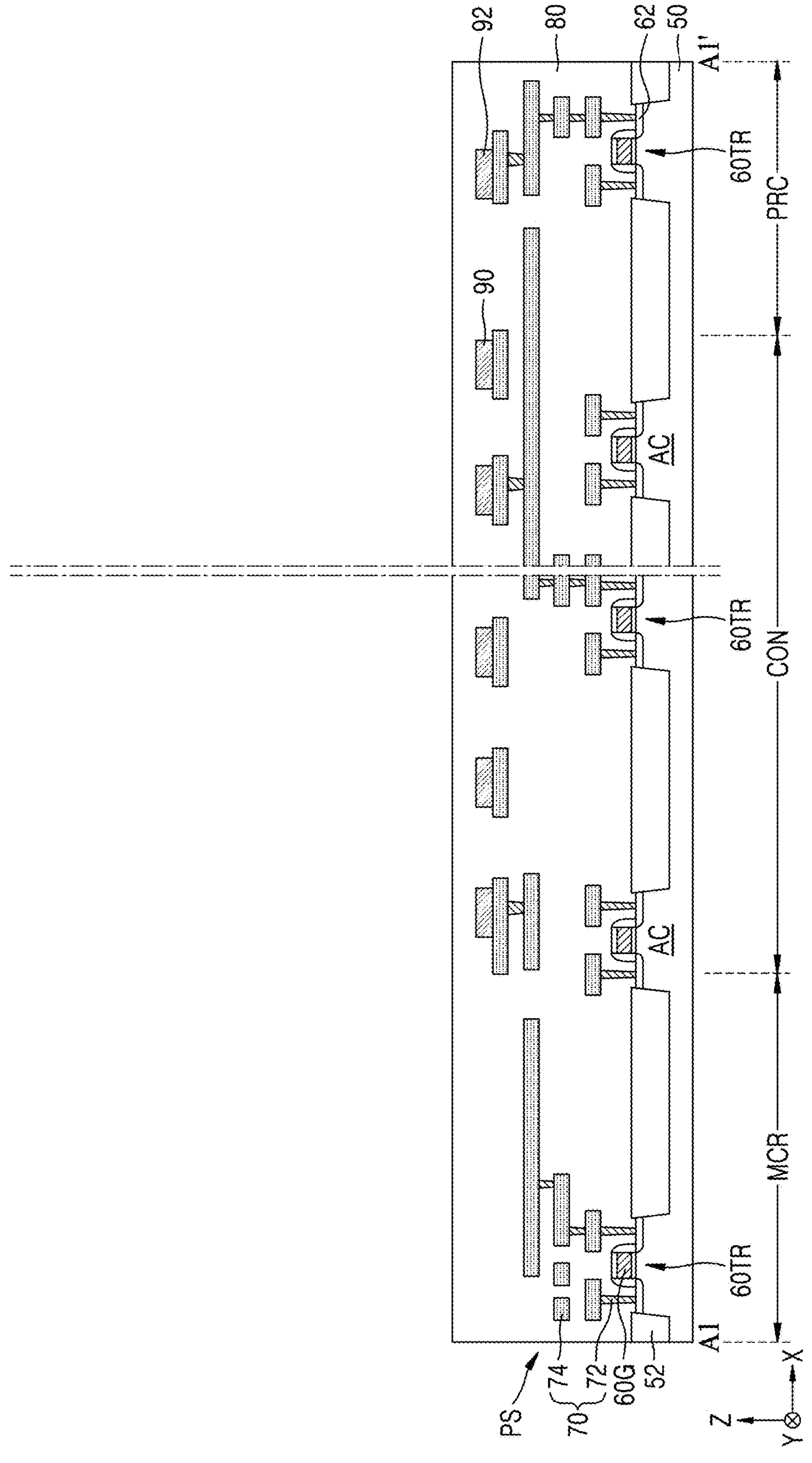
FIGS. 14 to 28 are cross-sectional views illustrating a method of manufacturing a semiconductor device according to example embodiments, and specifically, FIGS. 14 to 17, 18A. 22A. 23A, and 25A are cross-sectional views corresponding to the cross-section along the line A1-A1' of FIG. 4, and FIGS. 18B, 19 to 21, 22B, 23B, 24, 25B, and 26 to 28 are cross-sectional views corresponding to the section of a portion CX1 of FIG. 5.

Referring to FIG. 14, a peripheral circuit structure PS may be formed on a substrate 50. In example embodiments, the substrate 50 may be a single crystal silicon substrate. A plurality of peripheral circuit transistors 60TR may be formed on the substrate 50, and the peripheral circuit wiring structure 70 electrically connected to the peripheral circuit transistor 60TR and the interlayer insulating film 80 may be formed.

First and second conductive landing vias 90 and 92 may be further formed on the uppermost peripheral circuit wiring layer 74 in the peripheral circuit connection region PRC. For example, the first and second conductive landing vias 90 and 92 may be formed using polysilicon doped with n-type impurities. Upper surfaces of the first and second conductive landing vias 90 and 92 may be covered by the interlayer insulating film 80.

Figure 15:
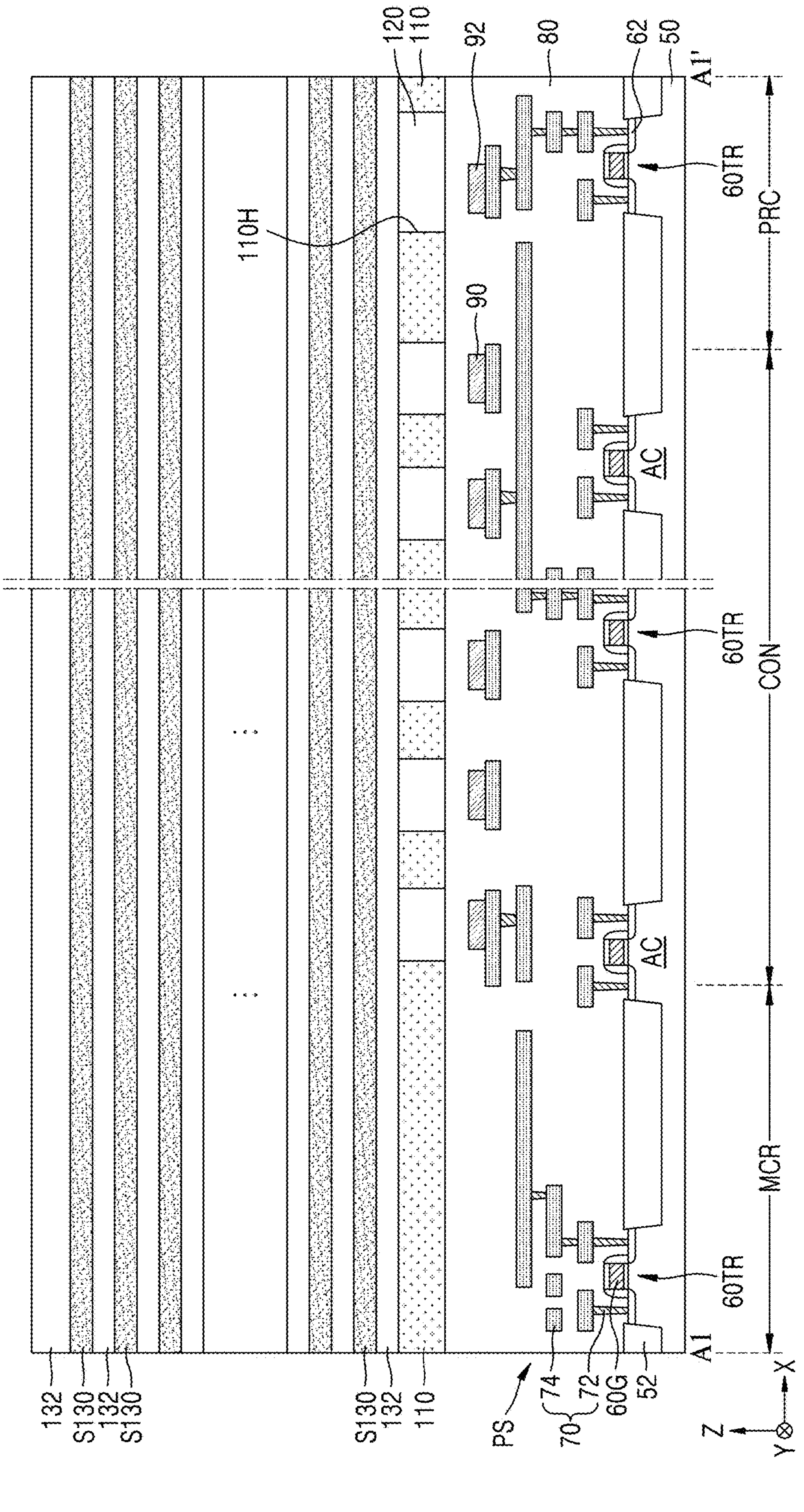

Referring to FIG. 15, a common source plate 110 may be formed on the interlayer insulating film 80. In some example embodiments, the common source plate 110 may be formed using a semiconductor doped with an n-type impurity.

Thereafter, a mask pattern (not shown) may be formed on the common source plate 110, and the opening 110H may be formed by removing a portion of the common source plate 110 using the mask pattern as an etch mask. The opening 110H may be formed in a region vertically overlapping at least a portion of the connection region CON and the peripheral circuit connection region PRC.

Thereafter, an insulating layer (not shown) filling the opening 110H may be formed on the common source plate 110, and the insulating plug 120 may be formed by planarizing the upper portion of the insulating layer until the upper surface of the common source plate 110 is exposed.

Thereafter, mold insulating layers 132 and sacrificial layers S130 may be alternately formed on the common source plate 110. In example embodiments, the mold insulating layers 132 may include an insulating material such as silicon oxide or silicon oxynitride, and the sacrificial layers S130 may include silicon nitride, silicon oxynitride, or polysilicon doped with impurities.

Figure 16:
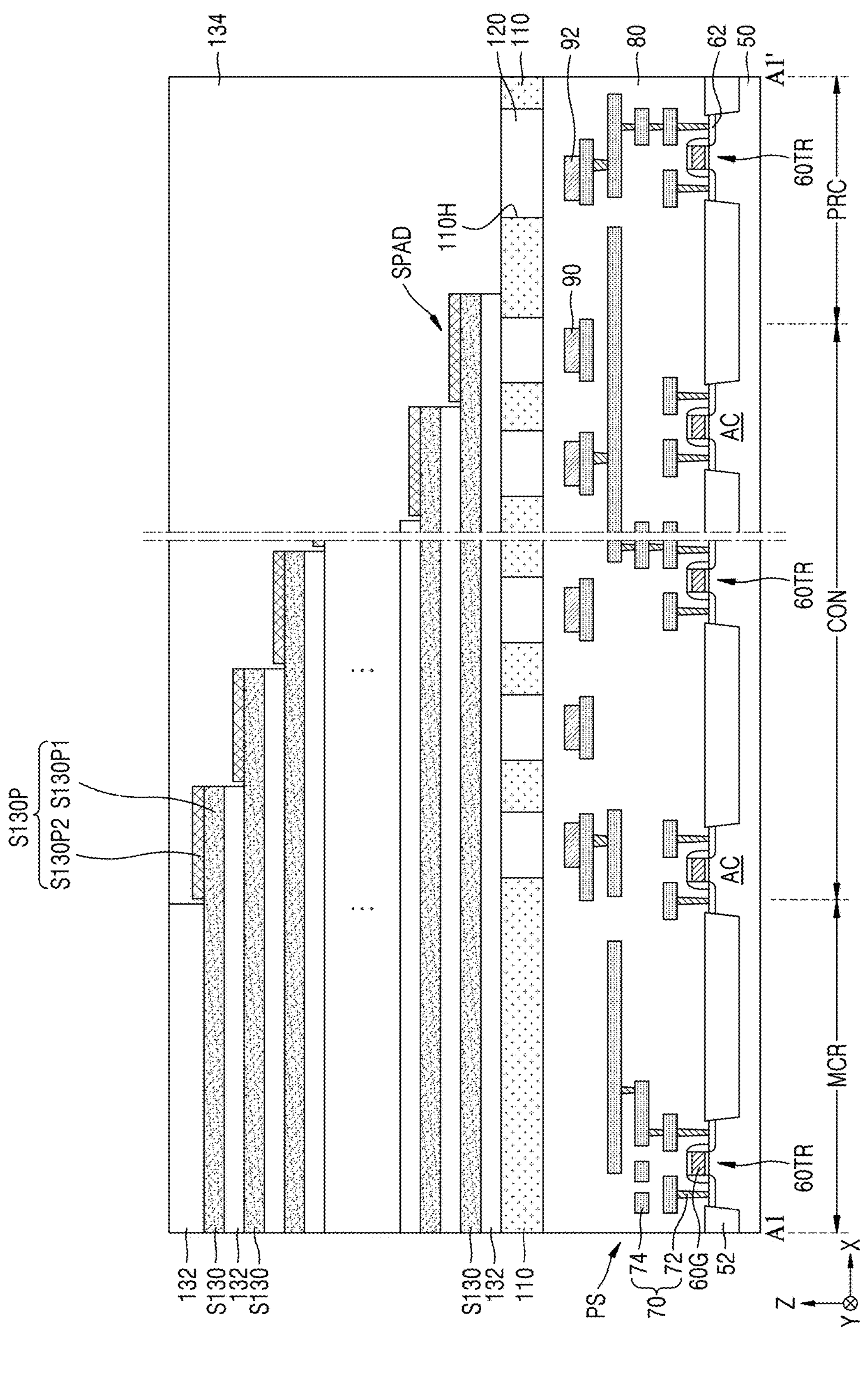

Referring to FIG. 16, the preliminary pad structure SPAD may be formed by sequentially patterning the mold insulating layers 132 and the sacrificial layers S130 on the connection region CON.

In example embodiments, the preliminary pad structure SPAD may be formed to have a stepped shape having a difference in upper surface level in the first horizontal direction (X direction) (see FIG. 4). For example, the preliminary pad structure SPAD may include preliminary pads S130P, and each of the preliminary pads S130P may include a first preliminary pad layer S130P1 and a second preliminary pad layer S130P2.

In example embodiments, the first preliminary pad layer S130P1 may indicate end portions of the sacrificial layers S130, and accordingly, the first preliminary pad layer S130P1 may include the same first insulating material as the sacrificial layers S130. The second preliminary pad layer S130P2 may include a material having an etch selectivity with respect to the first preliminary pad layer S130P1.

For example, the first preliminary pad layer S130P1 and the second preliminary pad layer S130P2 may include at least one of silicon nitride, silicon oxynitride, silicon oxide, silicon carbide, SiOC, spin-on hard mask (SOH), and poly-silicon but inventive concepts are not limited thereto. In some examples, the first preliminary pad layer S130P1 may include silicon nitride, and the second preliminary pad layer S130P2 may include silicon oxynitride.

After that, a cover insulating layer 134 covering the preliminary pad structure SPAD may be formed. The cover insulating layer 134 may include an insulating material such as silicon oxide or silicon oxynitride.

Figure 17:
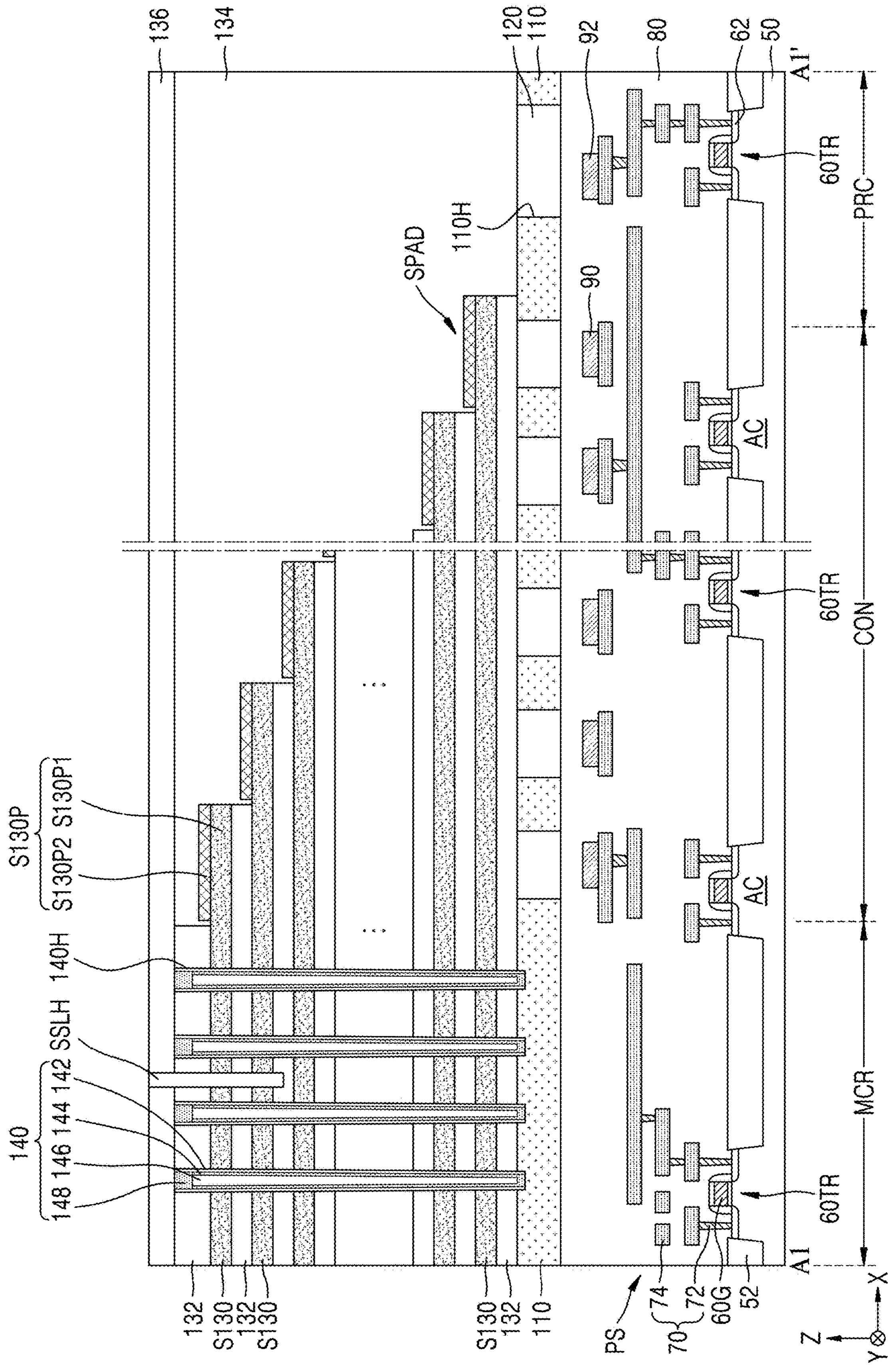

Referring to FIG. 17, a mask pattern (not shown) may be formed on the uppermost mold insulating layer 132 and the cover insulating layer 134, and channel holes 140H may be formed by patterning the mold insulating layers 132 and the sacrificial layers S130 using the mask pattern as an etching mask.

Thereafter, the channel 140 including the gate insulating layer 142, the channel layer 144, the buried insulating layer 146, and the conductive plug 148 may be formed on the inner wall of the channel hole 140H.

Although not shown in the drawing, in the process of forming the channel structure 140, a dummy channel structure penetrating the pad portion PAD in the connection region CON may be formed together.

Thereafter, a first upper insulating layer 136 covering the uppermost mold insulating layer 132, the cover insulating layer 134, and the channel 140 may be formed.

A string separation opening SSLH may be formed by removing the first upper insulating layer 136, the two uppermost sacrificial layers S130, and the two uppermost mold insulating layers 132 on the memory cell region MCR, and an insulating material may be used to form a string separation insulating layer SSLI filling the string separation opening SSLH.

Figure 18A:
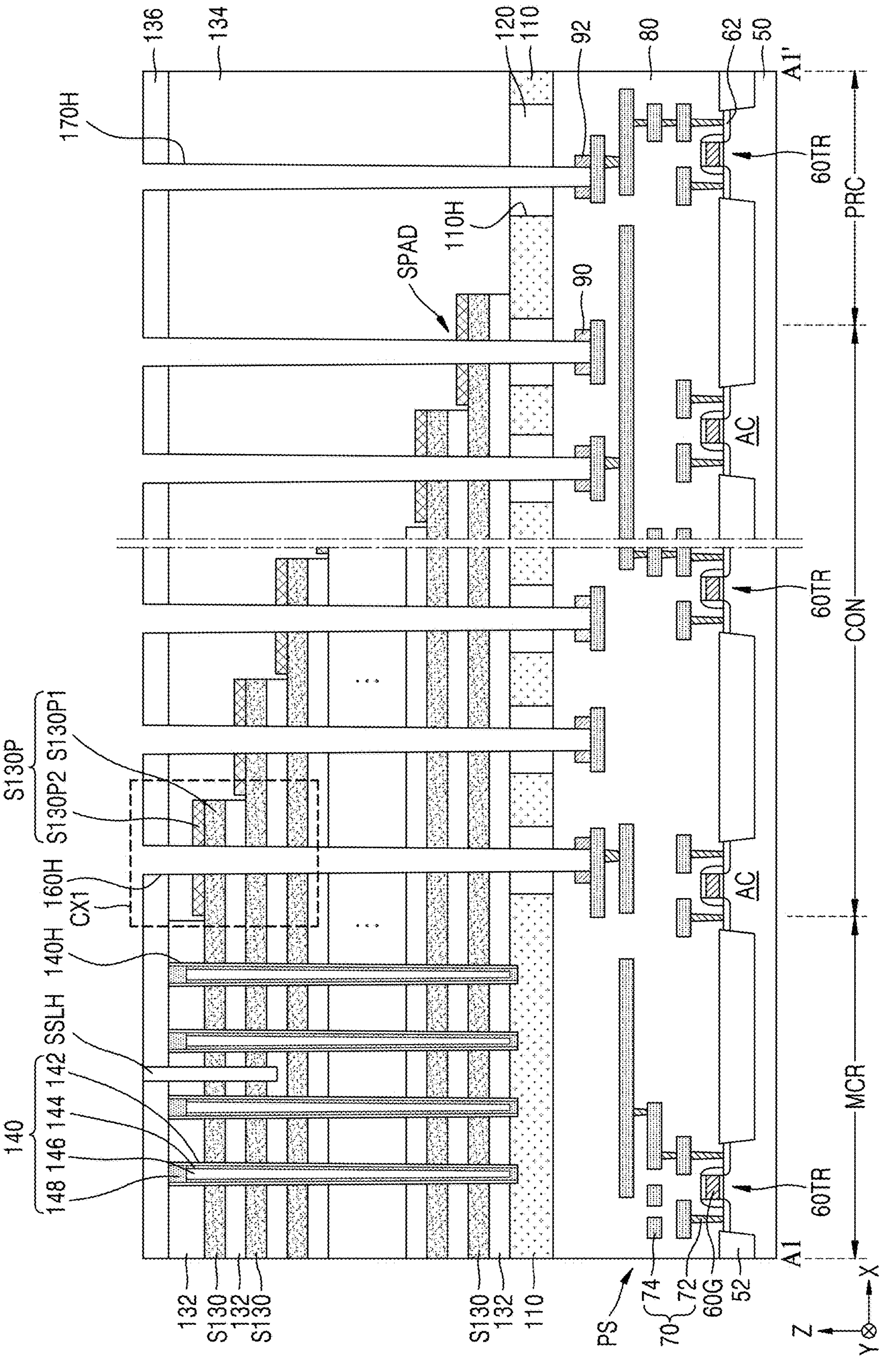
Figure 18B:
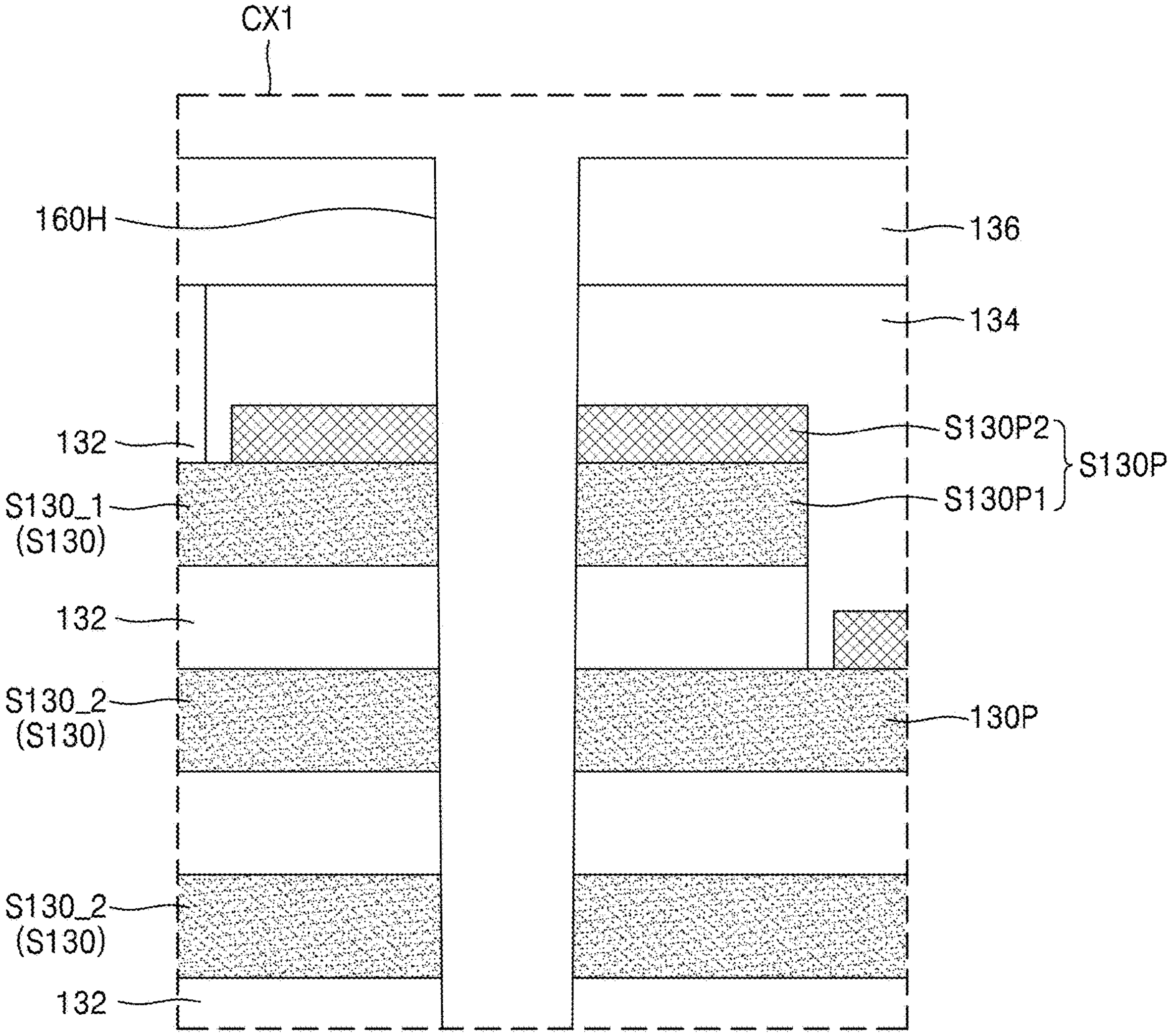

Referring to FIGS. 18A and 18B, by forming a mask pattern (not shown) on the first upper insulating layer 136 on the connection region CON and using the mask pattern as an etching mask, a first through via hole 160H may be formed through the first upper insulating layer 136, the preliminary pad structure SPAD, and the insulating plug 120. In addition, by using the mask pattern as an etching mask, a second through via hole 170H passing through the first upper insulating layer 136, the cover insulating layer 134, and the insulating plug 120 may be formed on the peripheral circuit connection region PRC.

In example embodiments, the first through via hole 160H may penetrate the preliminary pad S130P, and extend in the vertical direction Z through the sacrificial layers S130 and the mold insulating layers 132 disposed at a vertical level lower than the preliminary pad S130P. For example, as shown in FIG. 18B, the first through via hole 160H may pass through a preliminary pad S130P connected to the first sacrificial layer S130_1 among the sacrificial layers S130, and pass through the second sacrificial layers S130_2 disposed under the first sacrificial layer S130_1. The first through via hole 160H may extend from the upper surface of the first upper insulating layer 136 to the bottom surface of the insulating plug 120 in the vertical direction Z, and extend into the interlayer insulating film 80 to expose the upper surface of the first conductive landing via 90.

Figure 19:
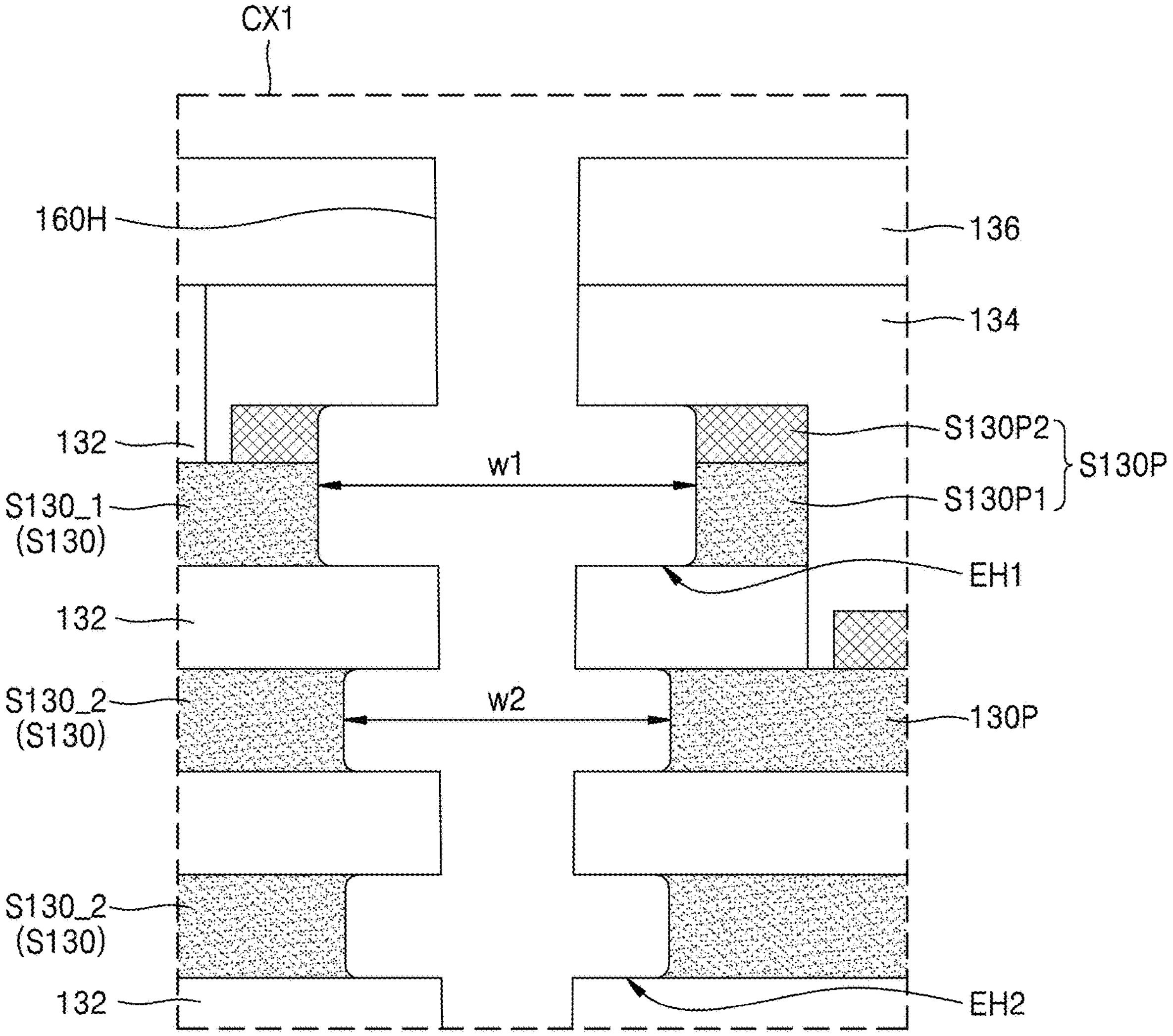

Referring to FIG. 19, a first extended opening EH1 may be formed by removing a portion of the preliminary pad S130P exposed on the inner wall of the first through via hole 160H, and a second extended opening EH2 may be formed by removing a portion of the sacrificial layer S130 exposed on the inner wall of the first through via hole 160H.

In example embodiments, the first extended opening EH1 may communicate with the first through via hole 160H and refer to a space between the cover insulating layer 134 and the mold insulating layer 132 and surrounded by the preliminary pad S130P. The second extended opening EH2 may communicate with the first through via hole 160H and refer to a space surrounded by the sacrificial layer S130 between two adjacent sacrificial layers S130 in the vertical direction Z. Each of the first extended opening EH1 and the second extended opening EH2 may have an annular shape or a ring-shaped horizontal cross section.

In example embodiments, the process for forming the first extended opening EH1 and the second extended opening EH2 may be an etching process using an etching recipe having a relatively high etching rate for the sacrificial layer S130, the first preliminary pad layer S130P1, and the second preliminary pad layer S130P2 while the etching rates for the mold insulating layer 132 and the cover insulating layer 134 are relatively low. In some embodiments, a process of forming the first extended opening EH1 and the second extended opening EH2 may be an etching process using an etchant including phosphoric acid (HPO3). In some embodiments, at least a portion of the sidewall of the first extended opening EH1 may have a rounded profile. For example, the upper and lower portions of the sidewall of the first extended opening EH1 may be exposed to a relatively small amount of etchant, and accordingly, the upper and lower portions of the sidewall of the first extended opening EH1 may have a rounded profile.

In example embodiments, the first extended opening EH1 may have a first width w1 in the first horizontal direction X, and the second extended opening EH2 may have a second width w2 less than the first width w1 in the first horizontal direction X. For example, the first width w1 of the first extended opening EH1 may be 110% to 150% of the second width w2 of the second extended opening EH2, but is not limited thereto.

In some example embodiments, in the process of forming the first extended opening EH1, the first preliminary pad layer S130P1 and the second preliminary pad layer S130P2 may have different etch rates, and accordingly, the first extended opening EH1 may be formed to have an inclined sidewall. For example, in the etching process, the second preliminary pad layer S130P2 may be removed at a higher etching rate than the first preliminary pad layer S130P1, and in this case, the first extended opening EH1 may have a shape having sidewalls inclined at an inclination angle so that the width of the upper part is greater than the width of the lower part, and the semiconductor device 100B described with reference to FIG. 10 may be formed.

Figure 20:
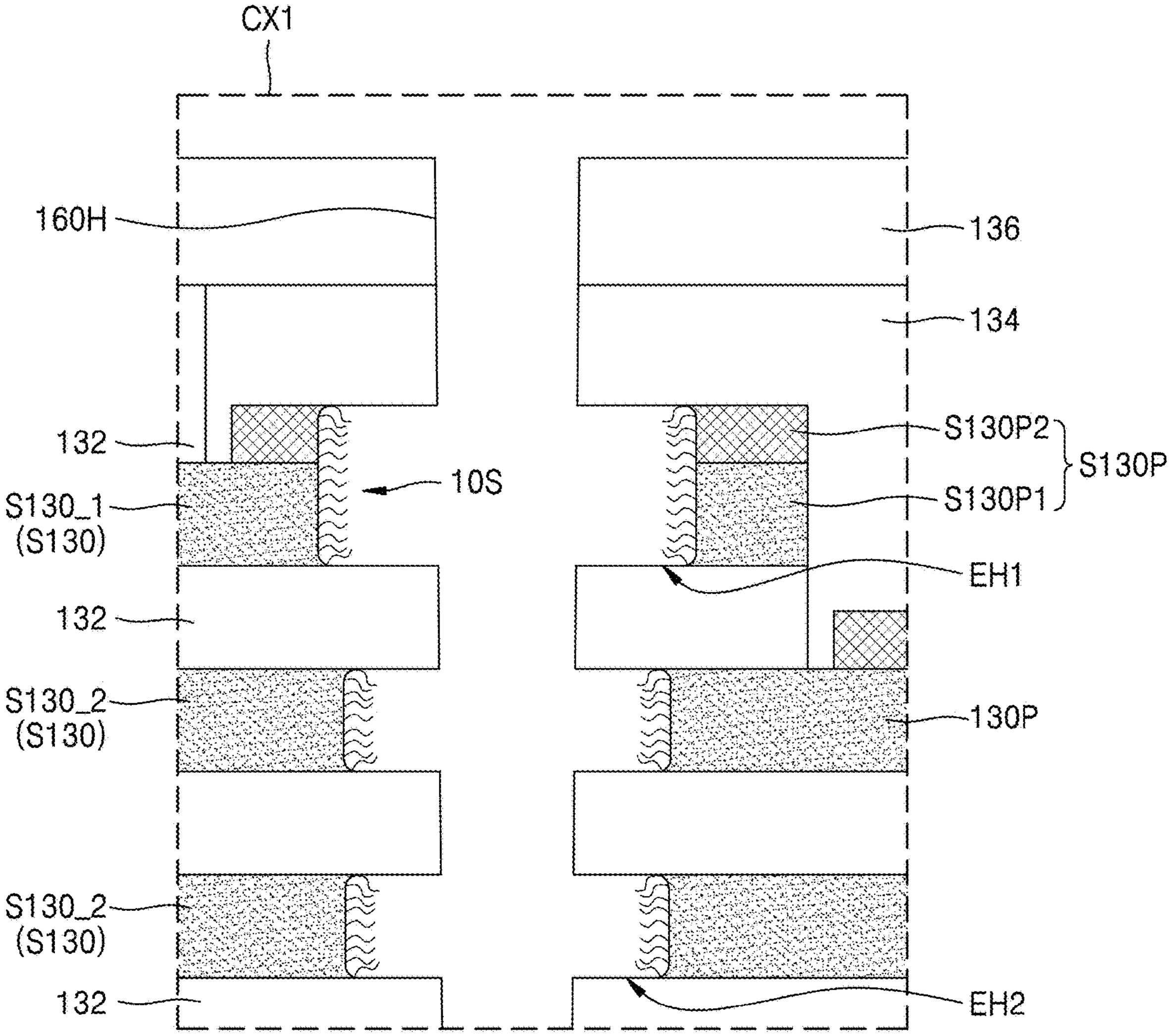

Referring to FIG. 20, a seeding treatment may be performed on the inner wall of the first through via hole 160H using a seeding precursor. The seeding precursor may include a material that is adsorbed by a stronger adsorption force on the surface of silicon nitride compared to the surface of silicon oxide. The seeding precursor may be adsorbed on the sidewall of the first extended opening EH1 and the sidewall of the second extended opening EH2 by the seeding treatment, thereby forming the seeding material layer 10S.

In example embodiments, the seeding precursor may include aminosilane-based compounds. The seeding precursor may include at least one of di(isopropylamino)silane (DIPAS), bis(tertiarybutylamino)silane (BTBAS), bis(diethylamino)silane (bis(diethylamino) silanc (BDEAS), butylaminosilane (BAS), dimethyl aminosilane (DMAS), bis (dimethylamino)silane (BDMAS), and tris(dimethylamino) silane (TDMAS).

In example embodiments, the seeding treatment may be performed by supplying the seeding precursor onto the substrate 50 at a treatment temperature of about 50° C. to about 100° C. for a feeding time of about 0.1 seconds to about 10 seconds. In example embodiments, the seeding treatment may include a single-step process of supplying the seeding precursor. In other embodiments, the seeding treatment may be performed by repeating a treatment cycle consisting of a feeding step of supplying the seeding precursor and a purge step of purging the seeding precursor a plurality of times. In other embodiments, the seeding treatment may include a first seeding treatment for supplying a first seeding precursor including an aminosilane-based precursor, and a second seeding treatment for supplying a second seeding precursor including an aminosilane-based precursor following the first seeding treatment. In some embodiments, a purging step of purging the first seeding precursor and the second seeding precursor may be further performed after the first seeding treatment and after the second seeding treatment.

In example embodiments, the seeding precursor is exposed to the sidewall of the first extended opening EH1 during the seeding treatment, and a relatively large amount of the seeding precursor may be adsorbed on the surfaces of the first preliminary pad layer S130P1 and the second preliminary pad layer S130P2 including silicon nitride. In addition, during the seeding treatment, the sidewall of the second extended opening EH2 may be exposed to the seeding precursor and relatively large amount of the seeding precursor may be adsorbed on the surface of the sacrificial layer S130 including silicon nitride, and on the other hand, only a small amount of the seeding precursor may be adsorbed on the surface of the cover insulating layer 134 and the surface of the mold insulating layer 132 exposed on the top and bottom of the first extended opening EH1.

Figure 21:
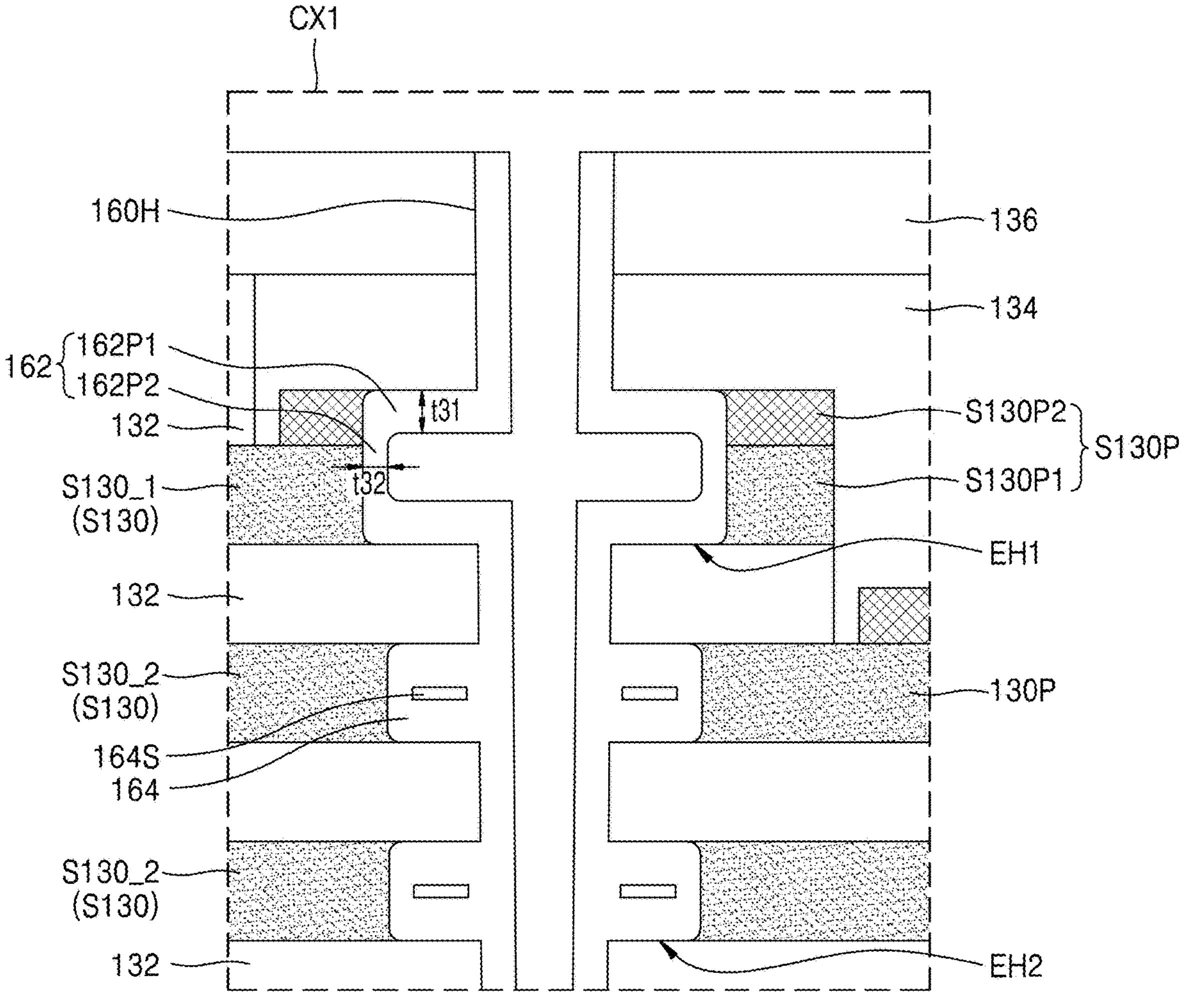

Referring to FIG. 21, a separation insulating layer 162 may be formed on an inner wall of the first through via hole 160H. The separation insulating layer 162 may be conformally formed on inner walls of the first through via hole 160H and on inner walls of the first extended opening EH1 and the second extended opening EH2.

In example embodiments, the separation insulating layer 162 may be formed to a non-conformal thickness on the inner wall of the first extended opening EH1. The first portion 162P1 of the separation insulation layer 162 disposed on the surface of the cover insulation layer 134 and the surface of the mold insulation layer 132 at the top and bottom of the first extended opening EH1 may have a first thickness t31. The seeding material layer 10S adsorbed on the sidewall of the first extended opening EH1 is removed and a second portion 162P2 of the separation insulating layer 162 may be formed on the sidewall of the first extended opening EH1 to have a second thickness t32 less than the first thickness t31.

In example embodiments, the separation insulating layer 162 may be formed using silicon oxide by an atomic layer deposition (ALD) process, a chemical vapor deposition (CVD) process, or the like. In example embodiments, the seeding treatment described with reference to FIG. 20 may be additionally performed during a process for forming the separation insulating layer 162. For example, a seeding precursor supply step may be additionally provided during the precursor supply step for forming the separation insulating layer 162. 1 to 10 cycles of supplying a seeding precursor may be performed for every 1 to 50 cycles of supplying a precursor for forming the separation insulating layer 162.

As the seeding treatment for supplying the seeding precursor is performed before forming the separation insulating layer 162 and/or during the step for forming the separation insulating layer 162, selective deposition of the separation insulating layer 162 may be achieved, and accordingly, a ratio of the second thickness t32 of the second portion 162P2 to the first thickness t31 of the first portion 162P1 on the inner wall of the first extended opening EH1 may be reduced.

Meanwhile, the separation insulating layer 162 may be formed on the inner wall (e.g., on the surface of the mold insulating layer 132) of the first through via hole 160H to a thickness similar to the first thickness t31 and may fill the inside of the second extended opening EH2. A portion of the separation insulating layer 162 filling the inside of the second extended opening EH2 may be referred to as an insulating pattern 164. In some embodiments, in the process for forming the insulating pattern 164 inside the second extended opening EH2, a scam 164S may be formed inside the insulating pattern 164 by blocking an inlet of the second extended opening EH2 while the inside of the insulating pattern 164 is filled with air or gas.

Figure 22A:
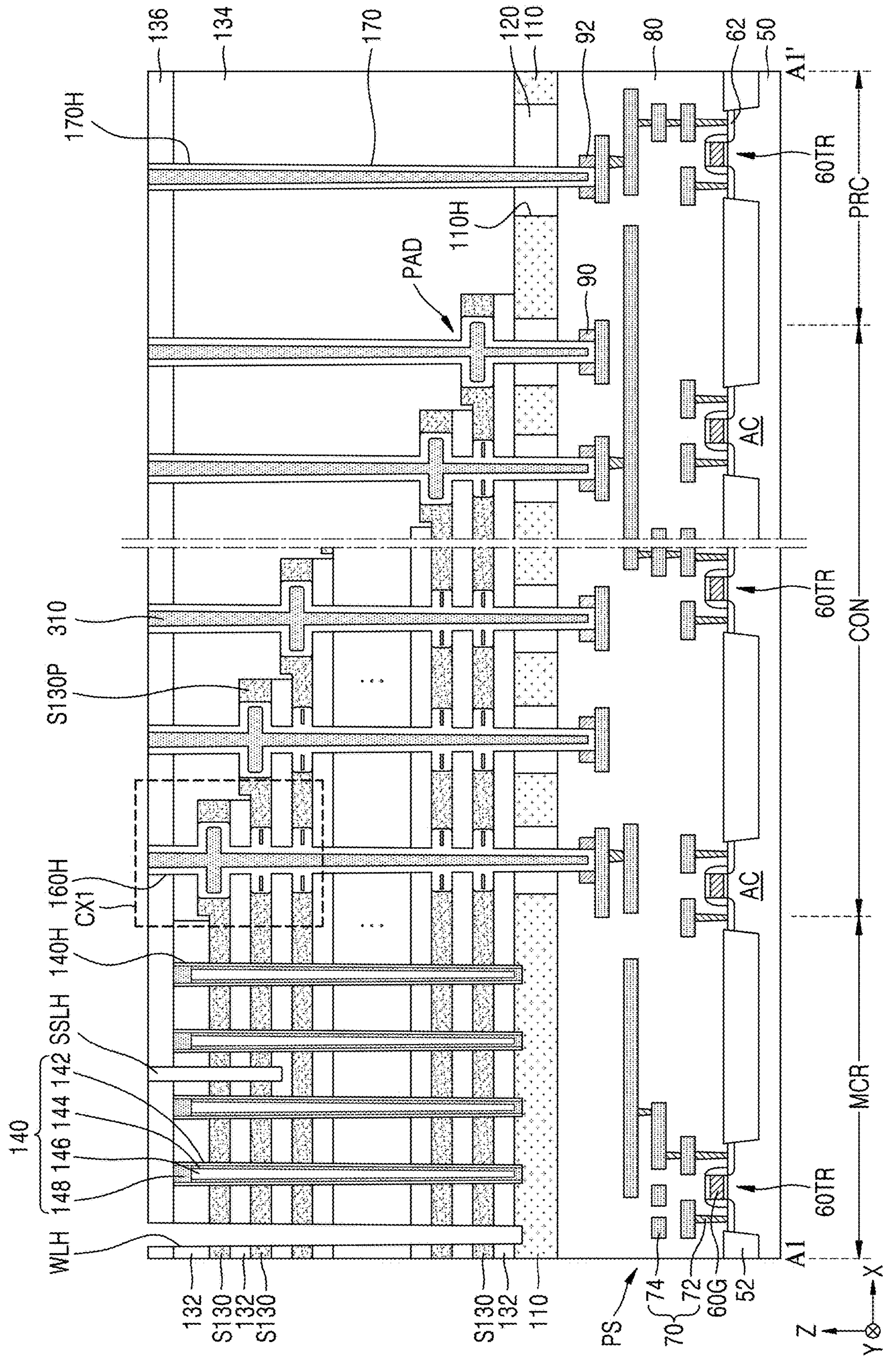
Figure 22B:
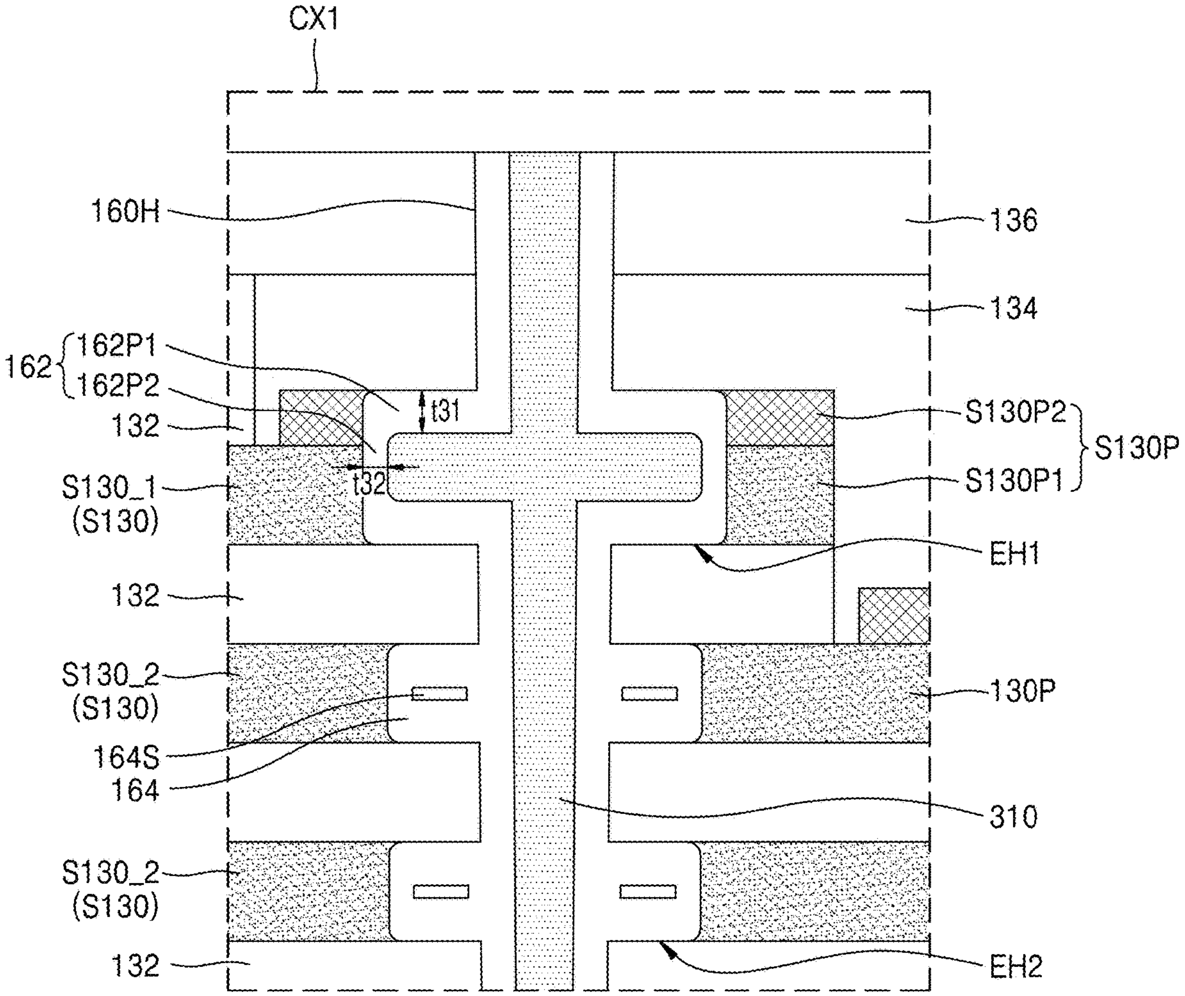

Referring to FIGS. 22A and 22B, a first sacrificial plug 310 filling the first through via hole 160H may be formed on the separation insulating layer 162. For example, the first sacrificial plug 310 may be formed using polysilicon, but is not limited thereto. Although not shown, an insulating spacer (not shown) may be further formed between the separation insulating layer 162 and the first sacrificial plug 310.

In example embodiments, in the process of forming the first sacrificial plug 310, the second sacrificial plug 320 filling the second through via hole 170H on the peripheral circuit connection region PRC may be formed together. For example, the second sacrificial plug 320 may be formed using polysilicon, but is not limited thereto.

Thereafter, a mask pattern (not shown) may be formed on the first upper insulating layer 136, and a gate stack separation opening WLH may be formed by removing portions of the mold insulating layers 132 and the sacrificial layers S130 using the mask pattern as an etching mask. The sacrificial layers S130 may be exposed on inner walls of the gate stack separation opening WLH.

Figure 23A:
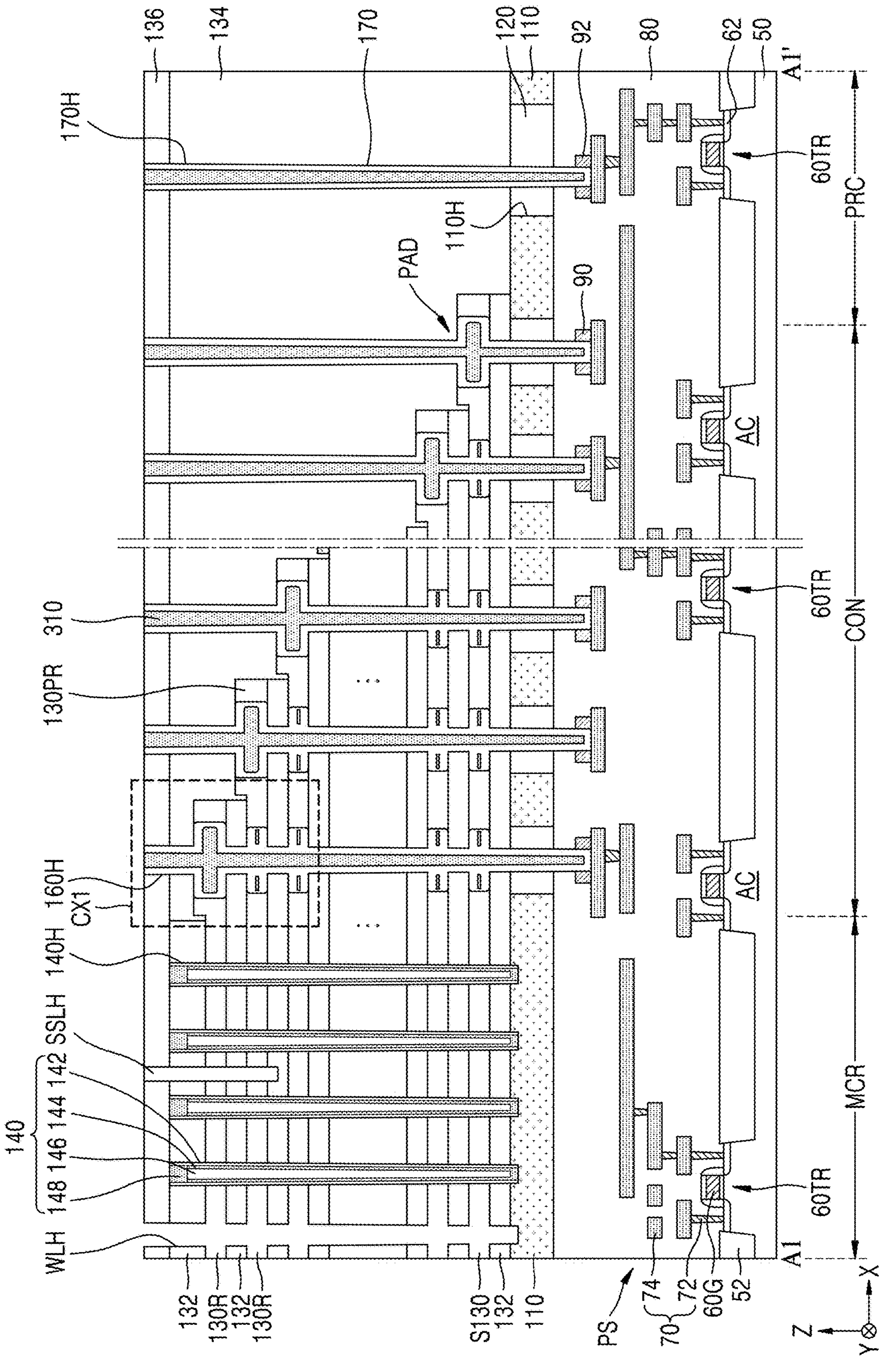
Figure 23B:
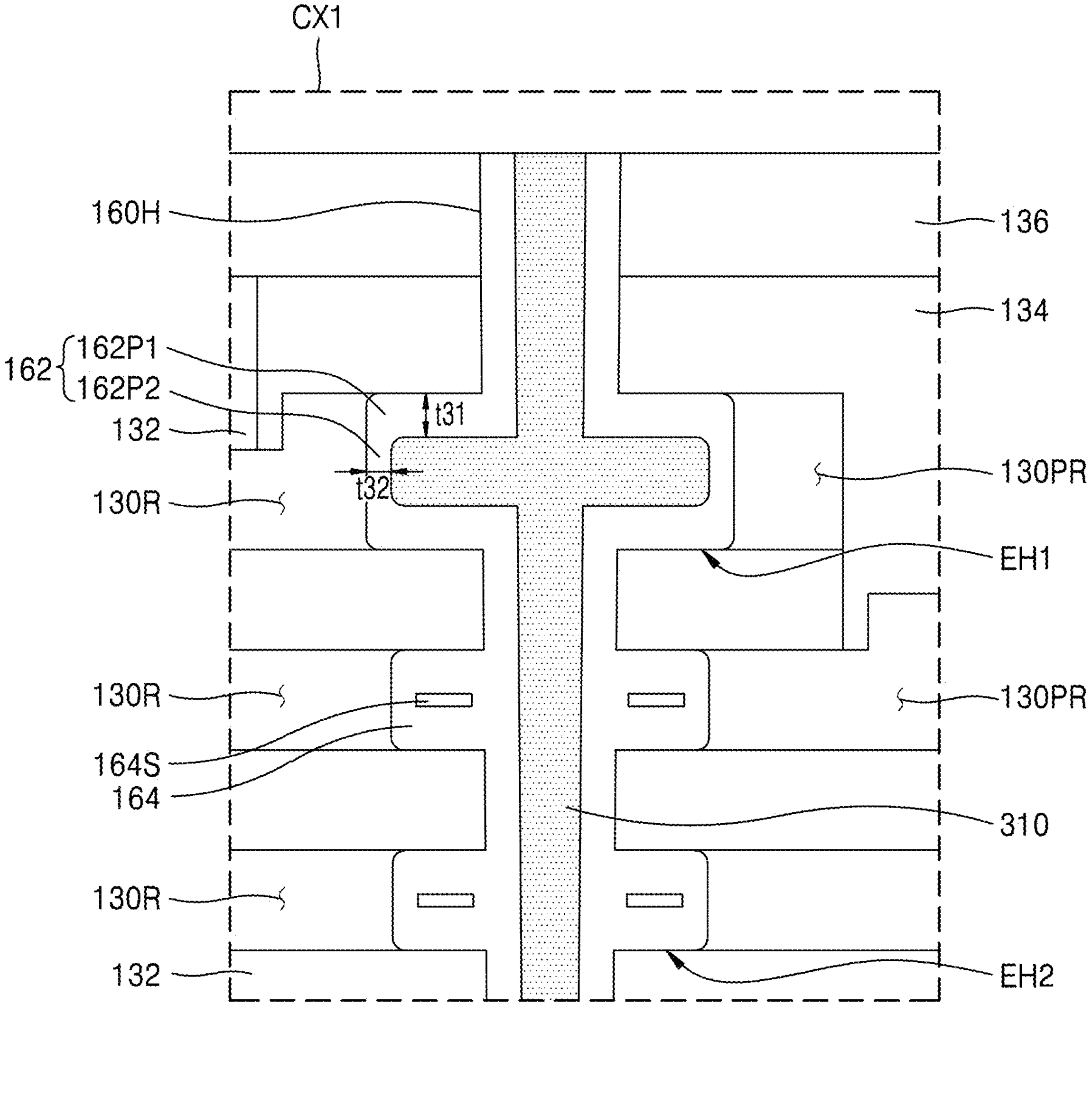

Referring to FIGS. 23A and 23B, the plurality of gate spaces 130R may be formed by removing the sacrificial layers S130 exposed on the sidewall of the gate stack separation opening WLH. In example embodiments, the process of removing the sacrificial layers S130 may be a wet etching process using a phosphoric acid solution as an etchant. As the sacrificial layers S130 are removed, a portion of the sidewall of the channel 140 may be exposed. In the process of removing the sacrificial layers S130, the preliminary pad S130P may be removed together to form a pad space 130PR.

Figure 24:
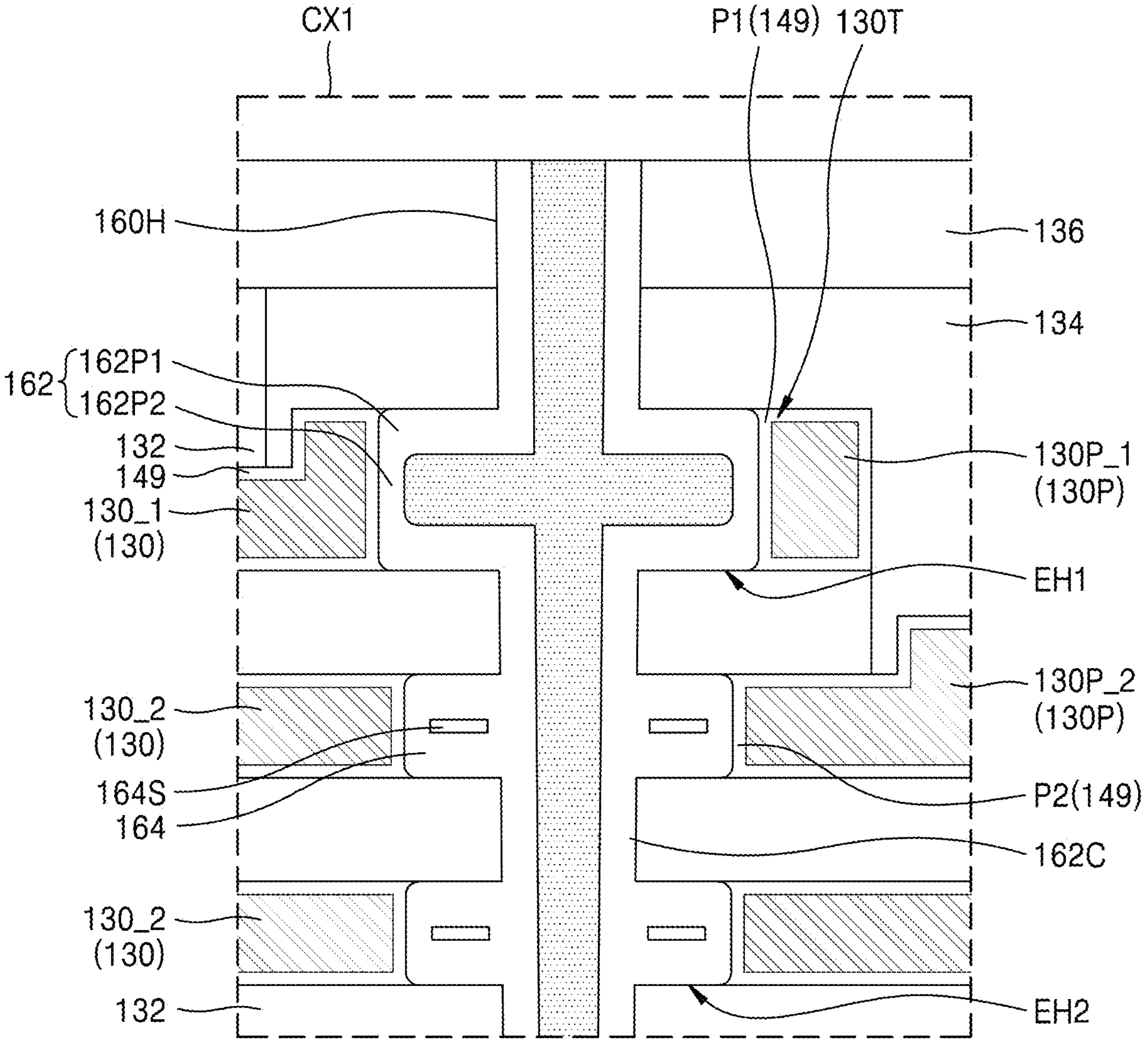

Referring to FIG. 24, a blocking insulating layer 149 may be formed on inner walls of the plurality of gate spaces 130R and pad spaces 130PR. The blocking insulating layer 149 may be conformally disposed on inner walls of the plurality of gate spaces 130R and pad spaces 130PR.

Thereafter, the gate electrodes 130 may be formed by filling the plurality of gate spaces 130R with a conductive material. In addition, the pad 130P may be formed by burying a conductive material together in the pad space 130PR.

Figure 25A:
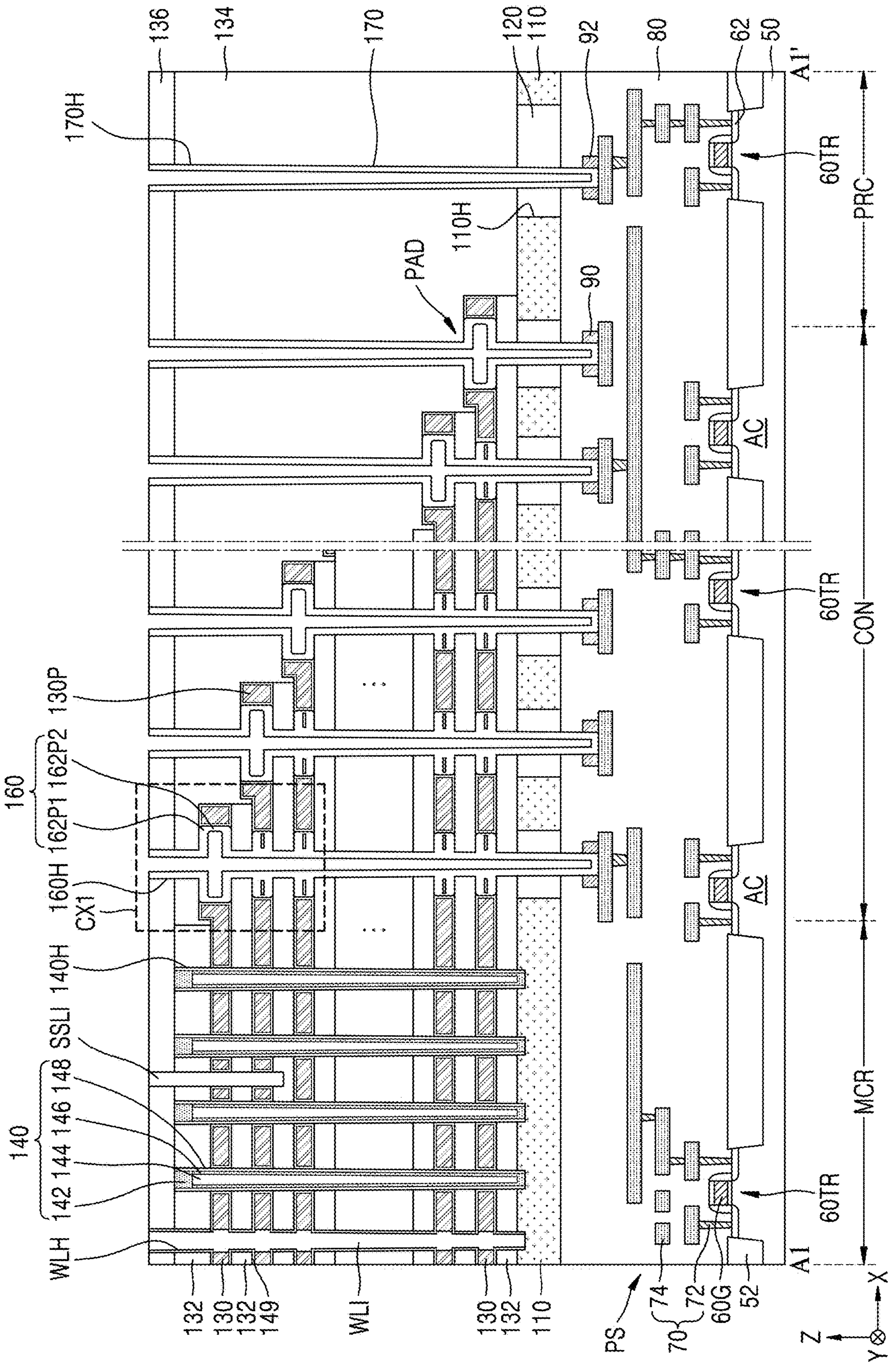
Figure 25B:
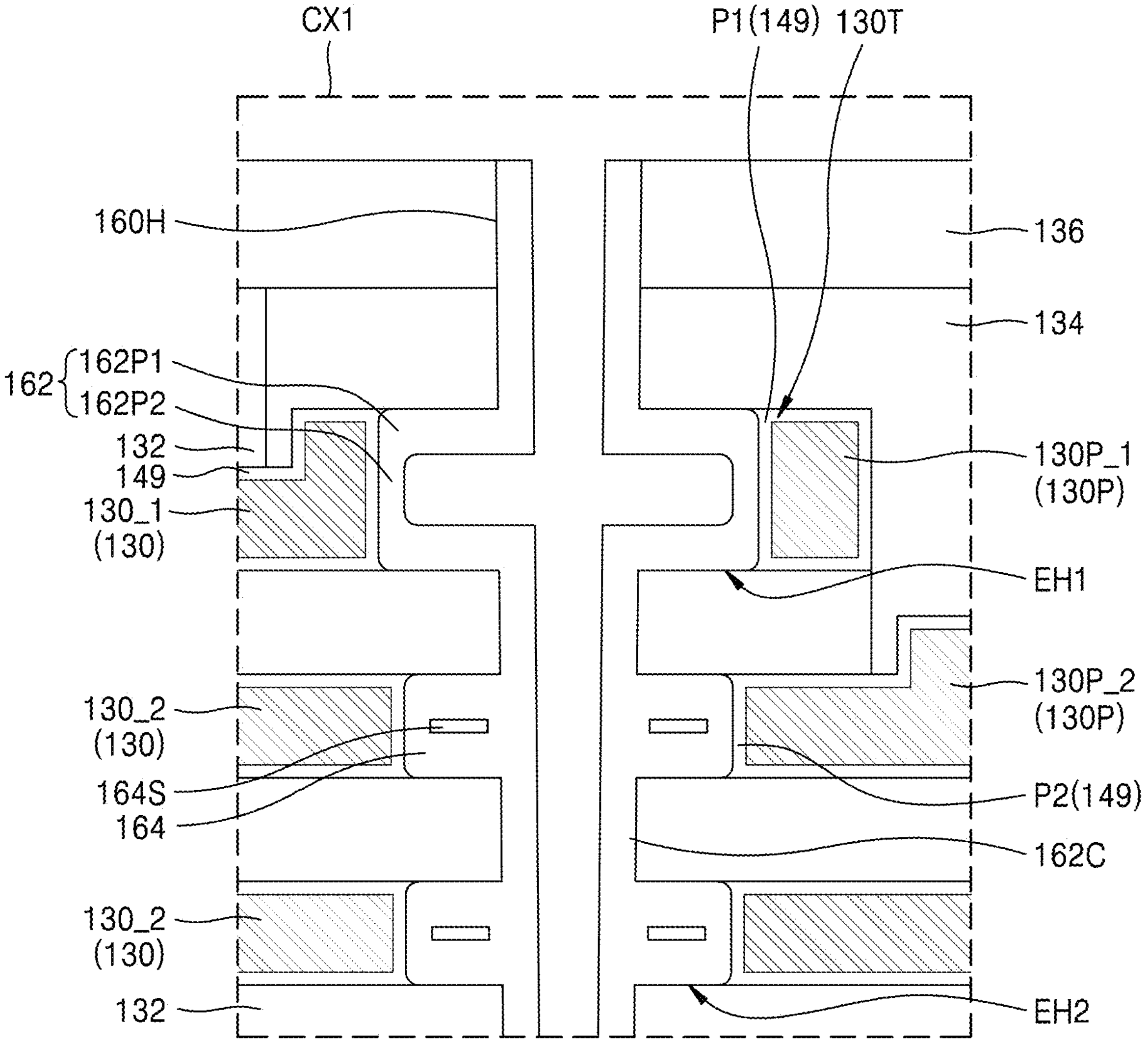

Referring to FIGS. 25A and 25B, a gate stack separation insulating layer WLI may be formed by filling an insulating material inside the gate stack separation opening WLH.

Thereafter, the first sacrificial plug 310 and the second sacrificial plug 320 may be removed. As the first sacrificial plug 310 and the second sacrificial plug 320 are removed, the separation insulating layer 162 disposed on the inner walls of the first through via hole 160H and the second through via hole 170H is may be exposed again.

Figure 26:
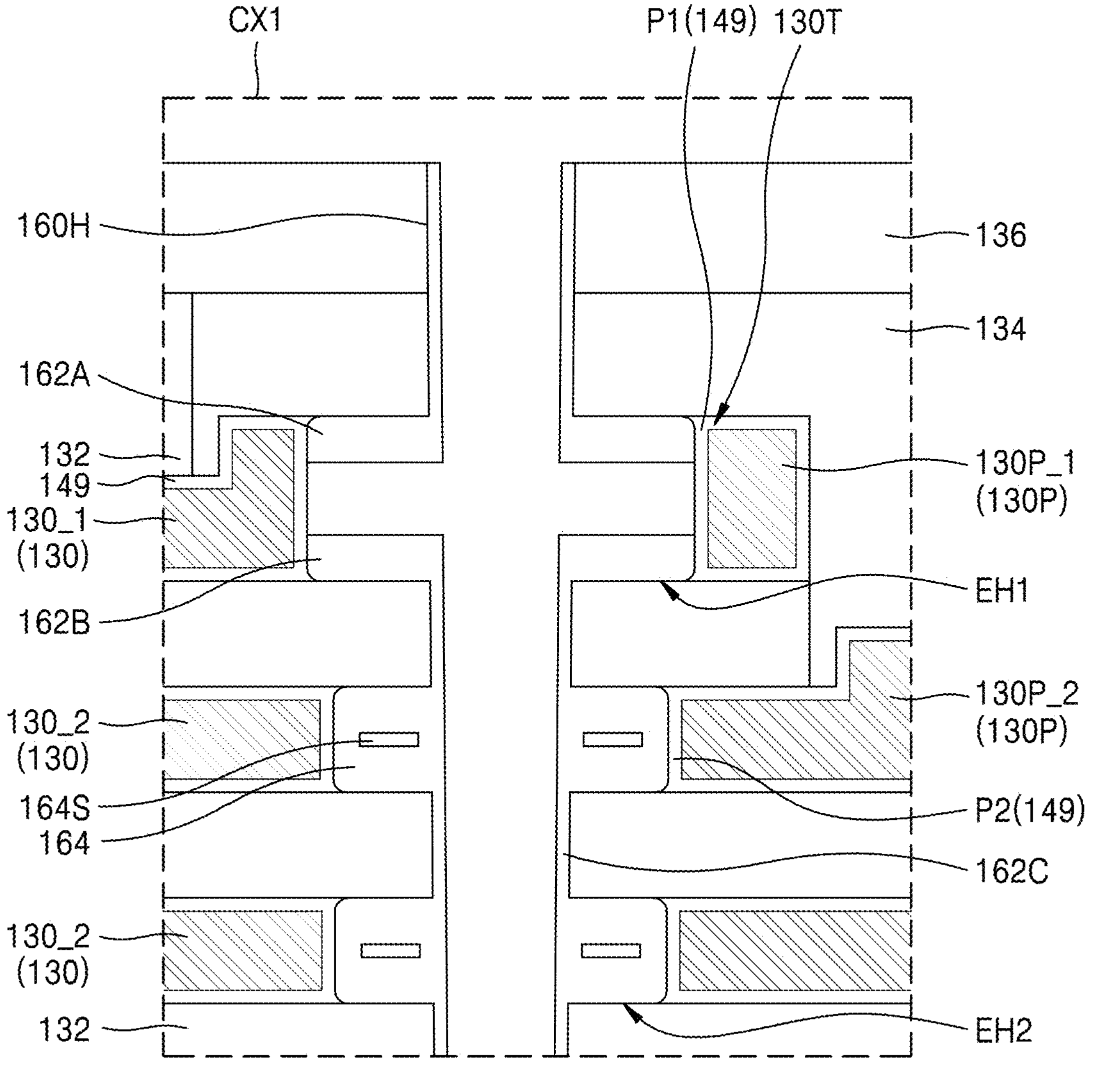

Referring to FIG. 26, a wet etching process may be performed to remove the second portion 162P2 of the separation insulating layer 162. In example embodiments, as the second portion 162P2 of the separation insulating layer 162 is formed to a less thickness than the first portion 162P1 of the separation insulating layer 162, the wet etching process may be performed until only the second portion 162P2 of the separation insulating layer 162 is completely removed while a portion of the first portion 162P1 of the separation insulating layer 162 remains. Accordingly, as the second portion 162P2 of the separation insulating layer 162 is removed, the sidewall of the blocking insulating layer 149 may be exposed on the sidewall of the first extended opening EH1, and a first separation insulating layer 162A and a second separation insulating layer 162B may remain on the upper and lower portions of the first extended opening EH1, respectively.

In the wet etching process, a portion of the separation insulating layer 162 disposed on the inner wall of the first through via hole 160H may also be removed, and a thickness of the separation insulating layer 162 disposed on the inner wall of the first through via hole 160H may be reduced. A portion of the separation insulating layer 162 disposed on the inner wall of the first through via hole 160H may be referred to as a sidewall insulating layer 162C.

Meanwhile, in the wet etching process, a portion of the insulating pattern 164 disposed inside the second extended opening EH2 may not be exposed to an etching atmosphere. For example, the seam 164S inside the insulating pattern 164 may not be damaged by the etchant of the wet etching process.

Figure 27:
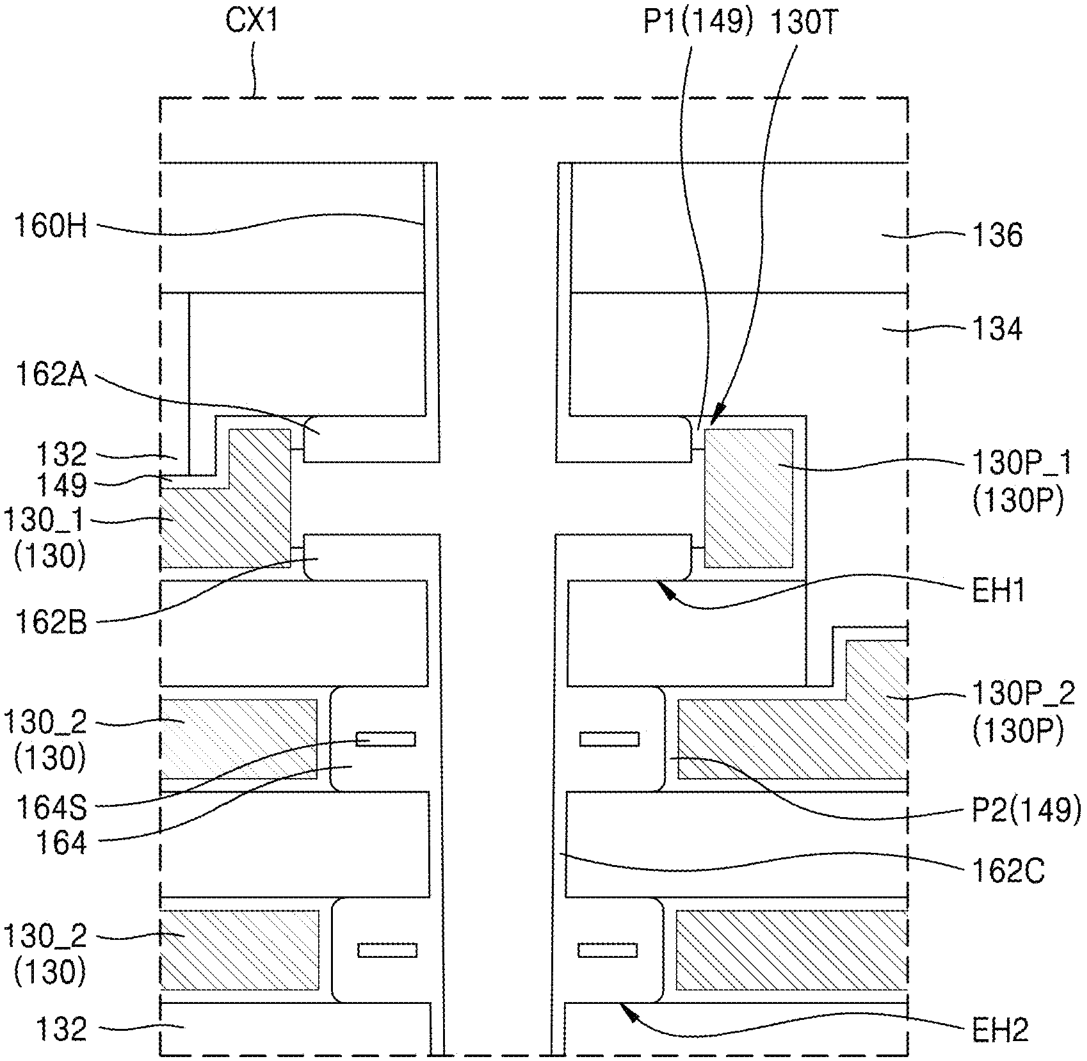

Referring to FIG. 27, a portion of the blocking insulating layer 149 exposed inside the first through via hole 160H may be removed to expose a sidewall of the pad 130P.

In example embodiments, an etching process using an etchant including fluorine (F) may be performed to remove the blocking insulating layer 149 including the high-k dielectric oxide. In the etching process, a portion of the blocking insulating layer 149 disposed between the pad 130P and the first separation insulating layer 162A and between the pad 130P and the second separation insulating layer 162B is removed, and an undercut region may be defined in the blocking insulating layer 149.

Figure 28:
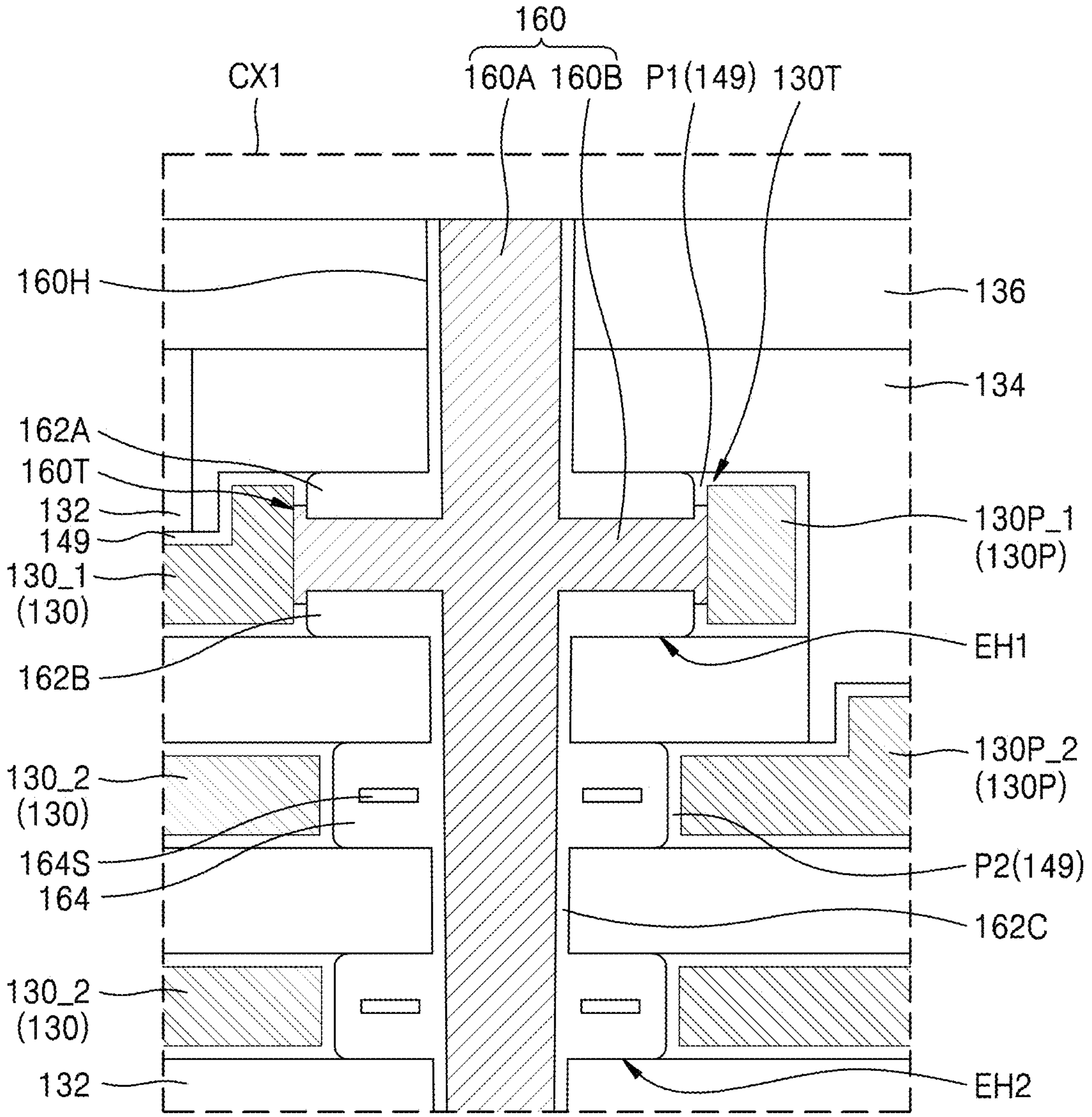

Referring to FIG. 28, a conductive layer (not shown) filling insides of the first through via hole 160H and the second through via hole 170H is formed, and the upper surface of the conductive layer is planarized until the upper surface of the first upper insulating layer 136 is exposed, so that the first through via 160 and the second through via 170 may be formed in the first through via hole 160H and the second through via hole 170H, respectively.

For example, the first through via 160 and the second through via 170 may be formed using tungsten, titanium, tantalum, copper, aluminum, titanium nitride, tantalum nitride, tungsten nitride, or a combination thereof.

Referring back to FIG. 5, a bit line contact BLC electrically connected to the channel 140 may be formed through the first upper insulating layer 136.

Then, a bit line BL electrically connected to the bit line contact BLC may be formed on the memory cell region MCR, and a wiring line ML1 electrically connected to the first through via 160 and the second through via 170 may be formed on the peripheral circuit connection region PRC. After that, a second upper insulating layer 138 may be formed on the first upper insulating layer 136 to surround the bit line BL and sidewalls of the wiring line ML1.

The semiconductor device 100 may be completed by performing the above-described processes.

In general, in a structure including cell contact plugs landed on the upper surface of the pad 130P, as the number of stacked gate electrodes 130 increases, the pad 130P is over-etched in the process of forming the cell contact hole, so that a punch-through defect in which the pad 130P is connected to the gate electrode 130 under the pad 130P may occur. To solve this problem, a structure including a first through via 160 penetrating the gate electrode 130 has been proposed. However, while the connection portion 160B of the first through via 160 and the first pad 130P_1 are electrically connected, it is difficult to secure electrical insulation between the first through via 160 and the second gate electrodes 130_2.

According to the foregoing example embodiments, a separation insulating layer 162L may be formed inside the first through via hole 160H, the first extended opening EH1, and the second extended opening EH2 using a selective deposition process, and a second portion of the separation insulating layer 162L disposed on the sidewall of the first extended opening EH1 may be formed to have a relatively thin thickness. Accordingly, for electrical connection between the connection portion 160B of the first through via 160 and the pad 130P, a process of removing the second portion of the separation insulating layer 162L may be performed for a relatively short time (so that a relatively small etching amount is obtained), and thus, reliability deterioration issues related to breakdown, which may occur due to over-etching the insulating pattern 164 or the sidewall insulating layer 162C, may be limited and/or prevented.

Figure 29:
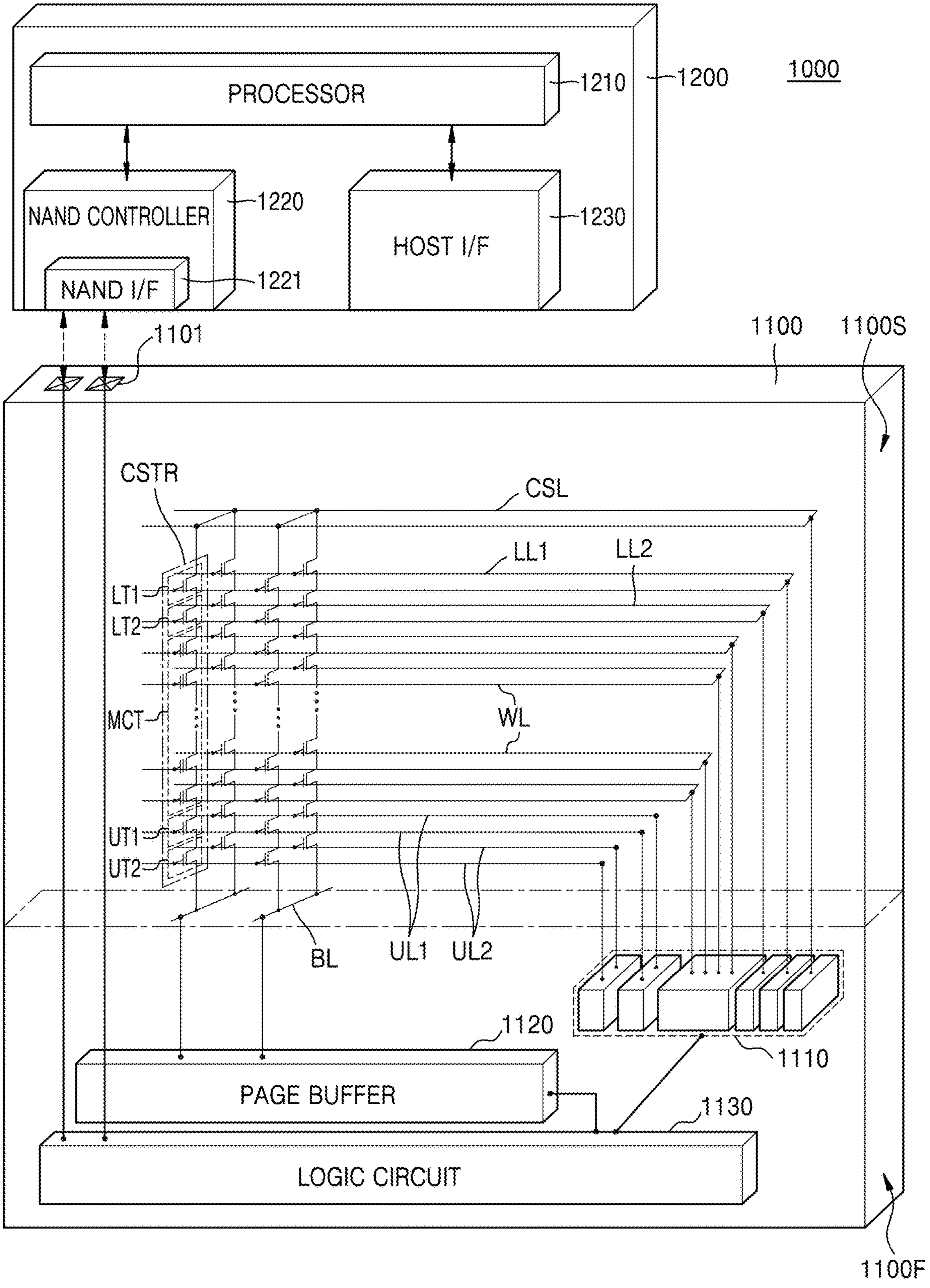
FIG. 29 is a diagram schematically illustrating a data storage system including a semiconductor device according to example embodiments.

FIG. 29 is a diagram schematically illustrating a data storage system 1000 including a semiconductor device according to example embodiments.

Referring to FIG. 29, the data storage system 1000 may include one or more semiconductor devices 1100 and a memory controller 1200 electrically connected to the semiconductor device 1100. The data storage system 1000 may be, for example, a solid state drive (SSD) device including at least one semiconductor device 1100, a universal serial bus (USB), a computing system, a medical device, or a communication device.

The semiconductor device 1100 may be a non-volatile semiconductor device, and for example, the semiconductor device 1100 may be a NAND flash semiconductor device including one of the semiconductor devices 10, 100, 100A, 100B, 100C, 100D, and 200 described with reference to FIGS. 1 to 13. The semiconductor device 1100 may include a first structure 1100F and a second structure 1100S on the first structure 1100F. The first structure 1100F may be a peripheral circuit structure including a row decoder 1110, a page buffer 1120, and a logic circuit 1130.

The second structure 1100S may be a memory cell structure including a bit line BL, a common source line CSL, a plurality of word lines WL, first and second string select lines UL1 and UL2, first and second ground select lines LL1 and LL2, and a plurality of memory cell strings CSTR between the bit line BL and the common source line CSL.

In the second structure 1100S, each of the plurality of memory cell strings CSTR may include ground select transistors LT1 and LT2 adjacent to the common source line CSL, string select transistors UT1 and UT2 adjacent to the bit line BL, and a plurality of memory cell transistors MCT disposed between the ground select transistors LT1 and LT2 and the string select transistors UT1 and UT2. The number of ground select transistors LT1 and LT2 and the number of string select transistors UT1 and UT2 may be variously modified according to embodiments.

In example embodiments, the plurality of ground select lines LL1 and LL2 may be connected to gate electrodes of the ground select transistors LT1 and LT2, respectively. The word line WL may be connected to a gate electrode of the memory cell transistor MCT. The plurality of string select lines UL1 and UL2 may be respectively connected to gate electrodes of the string select transistors UT1 and UT2.

The common source line CSL, the plurality of ground select lines LL1 and LL2, the plurality of word lines WL, and the plurality of string select lines UL1 and UL2 may be connected to the row decoder 1110. The plurality of bit lines BL may be electrically connected to the page buffer 1120.

The semiconductor device 1100 may communicate with the memory controller 1200 through the input/output pad 1101 electrically connected to the logic circuit 1130. The input/output pad 1101 may be electrically connected to the logic circuit 1130.

The memory controller 1200 may include a processor 1210, a NAND controller 1220, and a host interface 1230. In some embodiments, the data storage system 1000 may include a plurality of semiconductor devices 1100, and in this case, the memory controller 1200 may control the plurality of semiconductor devices 1100.

The processor 1210 may control the overall operation of the data storage system 1000 including the memory controller 1200. The processor 1210 may operate according to a preset firmware, and may access the semiconductor device 1100 by controlling the NAND controller 1220. The NAND controller 1220 may include a NAND interface 1221 that handles communication with the semiconductor device 1100. Through the NAND interface 1221, a control command for controlling the semiconductor device 1100, data to be written to the plurality of memory cell transistors MCT of the semiconductor device 1100, and data to be read from the plurality of memory cell transistors MCT of the semiconductor device 1100 may be transmitted. The host interface 1230 may provide a communication function between the data storage system 1000 and an external host. When receiving a control command from an external host through the host interface 1230, the processor 1210 may control the semiconductor device 1100 in response to the control command.

Figure 30:
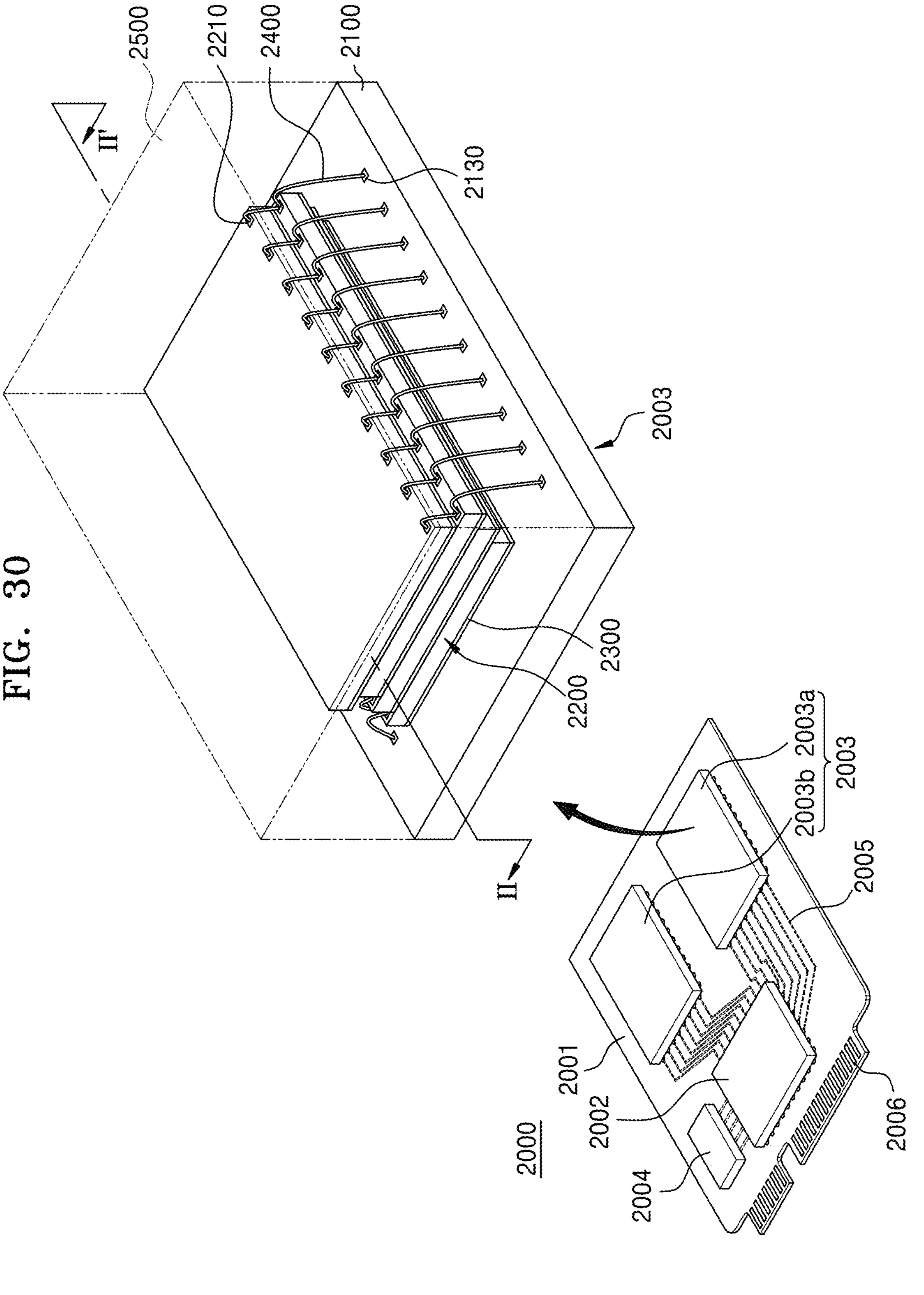
FIG. 30 is a perspective view schematically illustrating a data storage system including a semiconductor device according to example embodiments.

FIG. 30 is a perspective view schematically illustrating a data storage system 2000 including a semiconductor device according to example embodiments.

Referring to FIG. 30, a data storage system 2000 according to an example embodiment may include a main board 2001, a memory controller 2002 mounted on the main board 2001, one or more semiconductor packages 2003, and a DRAM 2004. The semiconductor package 2003 and the DRAM 2004 may be connected to the memory controller 2002 by a plurality of wiring patterns 2005 formed on the main board 2001.

The main board 2001 may include a connector 2006 including a plurality of pins coupled to an external host. The number and arrangement of the plurality of pins in the connector 2006 may vary according to a communication interface between the data storage system 2000 and the external host. In example embodiments, the data storage system 2000 may communicate with an external host according to any one of the interfaces such as Universal Serial Bus (USB), Peripheral Component Interconnect Express (PCI-Express), Serial Advanced Technology Attachment (SATA), and M-Phy for Universal Flash Storage (UFS). In example embodiments, the data storage system 2000 may operate by power supplied from an external host through the connector 2006. The data storage system 2000 may further include a power management integrated circuit (PMIC) for distributing power supplied from the external host to the memory controller 2002 and the semiconductor package 2003.

The memory controller 2002 may write data to or read data from the semiconductor package 2003, and may improve the operating speed of the data storage system 2000.

The DRAM 2004 may be a buffer memory for reducing a speed difference between the semiconductor package 2003, that is, a data storage space, and an external host. The DRAM 2004 included in the data storage system 2000 may operate as a kind of cache memory, and may provide a space for temporarily storing data in a control operation for the semiconductor package 2003. When the data storage system 2000 includes the DRAM 2004, the memory controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, a plurality of semiconductor chips 2200 on the package substrate 2100, an adhesive layer 2300 disposed on a lower surface of each of the plurality of semiconductor chips 2200, a connection structure 2400 electrically connecting the plurality of semiconductor chips 2200 and the package substrate 2100, and a molding layer 2500 covering the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include an input/output pad 2210. The input/output pad 2210 may correspond to the input/output pad 1101 of FIG. 29. Each of the plurality of semiconductor chips 2200 may include at least one of the semiconductor devices 10, 100, 100A, 100B, 100C, 100D, and 200 described with reference to FIGS. 1 to 13.

In example embodiments, the connection structure 2400 may be a bonding wire electrically connecting the input/output pad 2210 and the package upper pad 2130. Accordingly, in the first and second semiconductor packages 2003*a* and 2003*b*, the plurality of semiconductor chips 2200 may be electrically connected to each other by a bonding wire method, and may be electrically connected to the package upper pad 2130 of the package substrate 2100. In example embodiments, in relation to the first and second semiconductor packages 2003*a* and 2003*b*, the plurality of semiconductor chips 2200 may be electrically connected to each other by a connection structure including a through silicon via (TSV) instead of the bonding wire type connection structure 2400.

In example embodiments, the memory controller 2002 and the plurality of semiconductor chips 2200 may be included in one package. In an example embodiment, the memory controller 2002 and the plurality of semiconductor chips 2200 are mounted on a separate interposer board different from the main board 2001, and the memory controller 2002 and the plurality of semiconductor chips 2200 may be connected to each other by wiring formed on the interposer substrate.

Figure 31:
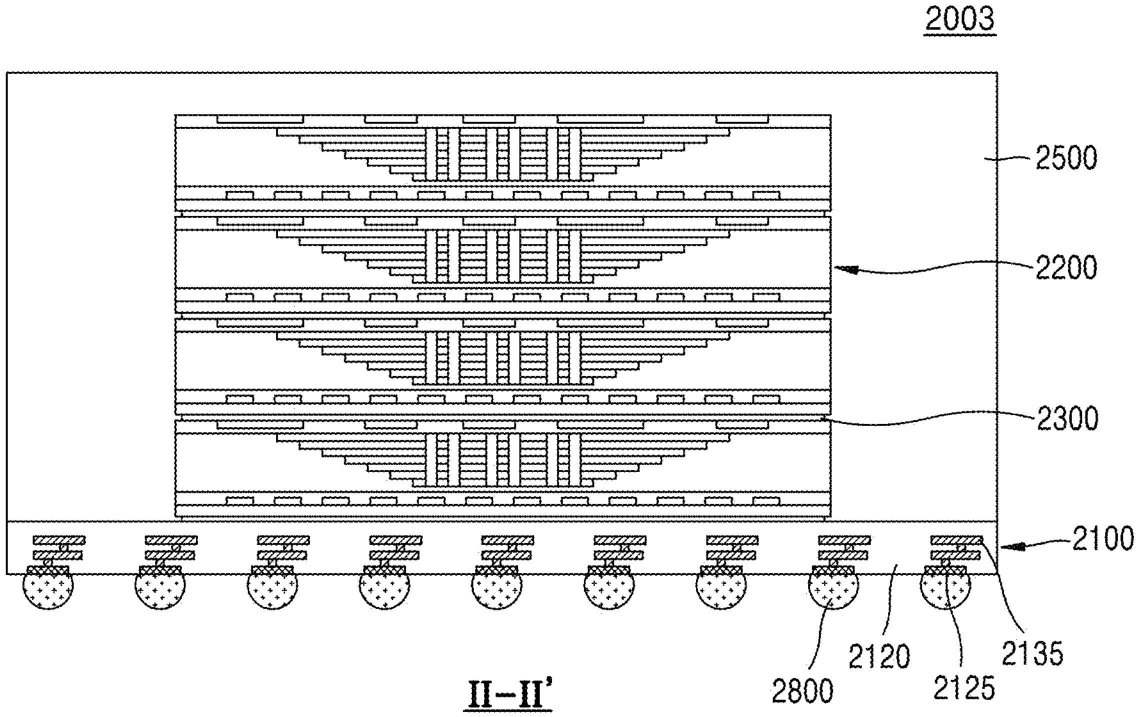
FIG. 31 is a cross-sectional view schematically illustrating semiconductor packages according to example embodiments.

FIG. 31 is a cross-sectional view schematically illustrating semiconductor packages 2003 according to example embodiments. FIG. 31 is a cross-sectional view taken along line II-II' of FIG. 30.

Referring to FIG. 31, in the semiconductor package 2003, the package substrate 2100 may be a printed circuit board. The package substrate 2100 may include a package substrate body part 2120, a plurality of package upper pads 2130 (refer to FIG. 30) disposed on the upper surface of the package substrate body part 2120; a plurality of lower pads 2125 disposed on or exposed through the lower surface of the package substrate body 2120, and a plurality of internal wirings 2135 that electrically connect the plurality of package upper pads 2130 (refer to FIG. 30) and the plurality of lower pads 2125 in the package substrate body 2120. As shown in FIG. 31, the plurality of package upper pads 2130 may be electrically connected to the plurality of connection structures 2400. As shown in FIG. 31, the plurality of lower pads 2125 may be connected to the plurality of wiring patterns 2005 on the main board 2001 of the data storage system 2000 shown in FIG. 30 through the plurality of conductive bumps 2800. Each of the plurality of semiconductor chips 2200 may include at least one of the semiconductor devices 10, 100, 100A, 100B, 100C, 100D, and 200 described with reference to FIGS. 1 to 13.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. A semiconductor device comprising:
- a substrate;
- gate electrodes on an upper surface of the substrate, the gate electrodes including pads disposed in a stepped shape, the gate electrodes being spaced apart from each other in a first direction, the first direction perpendicular to the upper surface of the substrate, the gate electrodes including a first gate electrode and second gate electrodes, the second gate electrodes below the first gate electrode;
- a channel extending in the first direction through the gate electrodes;
- a first through via passing through and electrically connected to a first pad of the first gate electrode, the first pad being among the pads, the first through via passing through the second gate electrodes, the first through via including a conductive pillar extending in the first direction and a connection portion connected to the conductive pillar, the connection portion being in contact with a sidewall of the first pad of the first gate electrode such that a connection between the connection portion and the first pad is a sidewall-to-sidewall connection;
- a first separation insulating layer on an upper surface of the connection portion of the first through via;
- a second separation insulating layer on a bottom surface of the connection portion of the first through via; and
- an insulating pattern between the first through via and sidewalls of the second gate electrodes opposing the first through via.

2. The semiconductor device of claim 1, wherein
- the first separation insulating layer and the second separation insulating layer have rounded sidewalls protruding outward toward the first pad, and
- the first pad has a protruding portion conforming to a shape of the rounded sidewalls of the first separation insulating layer and the second separation insulating layer.

3. The semiconductor device of claim 1, wherein, in a plan view, the first separation insulating layer and the second separation insulating layer have an annular shape.

4. The semiconductor device of claim 1, wherein
- the first gate electrode has a first thickness in the first direction,
- the first pad has a second thickness in the first direction,
- the second thickness is greater than the first thickness,
- the connection portion has a third thickness, and
- the third thickness is greater than the first thickness and less than the second thickness in the first direction.

5. The semiconductor device of claim 1, further comprising:
- a sidewall insulating layer surrounding a sidewall of the first through via, wherein
- the sidewall insulating layer is connected to the first separation insulating layer and the second separation insulating layer, and
- the sidewall insulating layer is connected to the insulating pattern.

6. The semiconductor device of claim 5, wherein
- the first separation insulating layer has a first thickness in the first direction,
- the second separation insulating layer has a second thickness in the first direction,
- the second thickness is substantially the same as the first thickness,
- the sidewall insulating layer has a third thickness, and
- the third thickness is less than the first thickness and the second thickness in a horizontal direction.

7. The semiconductor device of claim 1, further comprising:
- mold insulating layers between the gate electrodes; and
- a cover insulating layer covering the pads on the gate electrodes, wherein
- an upper surface of the first pad and an upper surface of the first separation insulating layer are covered by the cover insulating layer.

8. The semiconductor device of claim 7, wherein the first separation insulating layer is between the connection portion and the cover insulating layer.

9. The semiconductor device of claim 7, further comprising:

a blocking insulating layer on upper surfaces and sidewalls of the gate electrodes, wherein a first portion of the blocking insulating layer is between the first pad and a sidewall of the first separation insulating layer.

10. The semiconductor device of claim 9, wherein the first portion of the blocking insulating layer has a bottom surface at a level higher than a bottom surface of the first separation insulating layer, and the connection portion comprises a tuck portion in contact with the first portion of the blocking insulating layer.

11. The semiconductor device of claim 9, wherein the first portion of the blocking insulating layer is not disposed on at least a portion of a sidewall of the first pad facing the first through via, and a second portion of the blocking insulating layer is on a sidewall of the second gate electrodes facing the first through via.

12. The semiconductor device of claim 1, wherein the insulating pattern comprises a seam therein.

13. The semiconductor device of claim 12, further comprising:

a wedge pattern between a sidewall of the insulating pattern and a sidewall of the first through via.

14. The semiconductor device of claim 1, further comprising:

a circuit pattern on the substrate;

a wiring pattern on the substrate and electrically connected to the circuit pattern;

a lower interlayer insulating film on the substrate and covering the circuit pattern and the wiring pattern; and a common source plate on the lower interlayer insulating film, wherein the gate electrodes are on the common source plate, and the first through via penetrates the common source plate and is electrically connected to the wiring pattern.

15. A semiconductor device comprising:

a cell stack on a substrate, the cell stack including gate electrodes and mold insulating layers alternately disposed in a first direction perpendicular to an upper surface of the substrate, the gate electrodes including step-shaped pads, the cell stack further including a cover insulating layer covering the step-shaped pads, the gate electrodes including a first gate electrode and second gate electrodes, the second gate electrodes below the first gate electrode;

a channel passing through the cell stack and extending in the first direction;

a first through via passing through the cell stack and extending in the first direction, the first through via being connected to a first pad of the first gate electrode and passing through the second gate electrodes, the first pad being among the step-shaped pads, the first through via including a conductive pillar and a connection portion, the connection portion protruding outward laterally from the conductive pillar, wherein the connection portion is in contact with a sidewall of the first pad such that a connection between the connection portion and the first pad is a sidewall-to-sidewall connection;

an insulating pattern between the first through via and sidewalls of the second gate electrodes opposing the first through via, the insulating pattern electrically insulating the first through via and the second gate electrodes from each other;

a sidewall insulating layer surrounding sidewalls of the conductive pillar of the first through via; and a first separation insulating layer on an upper surface of the connection portion of the first through via.

16. The semiconductor device of claim 15, wherein the first separation insulating layer is between the connection portion and the cover insulating layer, and the first separation insulating layer is integrally connected to the sidewall insulating layer.

17. The semiconductor device of claim 15, further comprising:

a blocking insulating layer on upper surfaces of the gate electrodes and sidewalls of the gate electrodes, wherein a first portion of the blocking insulating layer is between the first pad and a sidewall of the first separation insulating layer, and wherein a second portion of the blocking insulating layer is on sidewalls of the second gate electrodes facing the first through via.

18. The semiconductor device of claim 17, wherein a bottom surface of the first portion of the blocking insulating layer is at a higher level higher than a bottom surface of the first separation insulating layer, and the connection portion comprises a tuck portion in contact with the first portion of the blocking insulating layer.

19. The semiconductor device of claim 15, wherein the first gate electrode has a first thickness in the first direction, the first pad has a second thickness that is greater than the first thickness in the first direction, and the connection portion has a third thickness that is greater than the first thickness and less than the second thickness in the first direction.

20. A semiconductor device comprising:

a substrate;

a circuit pattern on the substrate;

a wiring pattern on the substrate and electrically connected to the circuit pattern;

a lower interlayer insulating film on the substrate, the lower interlayer insulating film covering the circuit pattern and the wiring pattern;

a common source plate on the lower interlayer insulating film;

gate electrodes on the common source plate, the gate electrodes being spaced apart from each other in a first direction perpendicular to an upper surface of the substrate, the gate electrodes including pads disposed in a stepped shape, the gate electrodes including a first gate electrode and second gate electrodes, the second gate electrodes below the first gate electrode;

a channel extending in the first direction through the gate electrodes;

a first through via passing through and electrically connected to a first pad of the first gate electrode, the first pad being among the pads, the first through via passing through the second gate electrodes, the first through via including a conductive pillar extending in the first direction and a connection portion connected to the conductive pillar, the connection portion contacting the first pad of the first gate electrode, wherein the connection portion is in contact with a sidewall of the first pad such that a connection between the connection portion and the first pad is a sidewall-to-sidewall connection;

a sidewall insulating layer surrounding a sidewall of the conductive pillar of the first through via;

a first separation insulating layer on an upper surface of the connection portion of the first through via;

a second separation insulating layer on a bottom surface of the connection portion of the first through via;

an insulating pattern between the first through via and sidewalls of the second gate electrodes facing the first through via; and a blocking insulating layer on upper surfaces of the gate electrodes and sidewalls of the gate electrodes, the blocking insulating layer including a first portion between the first pad and a sidewall of the first separation insulating layer.

* * * * *